US012805133B2

(12) United States Patent
Yang et al.

(10) Patent No.: US 12,805,133 B2
(45) Date of Patent: Nov. 17, 2026

(54) DISPLAY DEVICE

(71) Applicant: LG Display Co., Ltd., Seoul (KR)

(72) Inventors: Yu Cheol Yang, Paju-si (KR); Yong In Park, Paju-si (KR); Seung Han Paek, Paju-si (KR); Sang Pyo Hong, Paju-si (KR); Seong Woo Park, Paju-si (KR); Nam Woo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 355 days.

(21) Appl. No.: 18/522,378

(22) Filed: Nov. 29, 2023

(65) Prior Publication Data

US 2024/0188359 A1 Jun. 6, 2024

(30) Foreign Application Priority Data

Dec. 2, 2022 (KR) ........................ 10-2022-0166366
Sep. 5, 2023 (KR) ........................ 10-2023-0117801

(51) Int. Cl.

| | |
|---|---|
| ***H10K 59/126*** | (2023.01) |
| ***H10K 59/131*** | (2023.01) |
| ***H10K 59/50*** | (2023.01) |
| ***H10K 59/80*** | (2023.01) |
| ***H10K 71/20*** | (2023.01) |
| *H10K 102/00* | (2023.01) |

(52) U.S. Cl.
CPC ......... *H10K 59/131* (2023.02); *H10K 59/126* (2023.02); *H10K 59/8794* (2023.02); *H10K 71/231* (2023.02); *H10K 2102/3026* (2023.02)

(58) Field of Classification Search
CPC ............... H10K 59/131; H10K 59/126; H10K 59/8794; H10K 59/80; H10K 59/12; H10K 59/8722; H10K 59/121; H10K 71/231; H10K 71/20; H10K 2102/3026; H10K 102/00; H10K 2102/311; H10K 71/70; H10K 71/861; H10K 71/621
See application file for complete search history.

(56) References Cited

U.S. PATENT DOCUMENTS

| | | | | |
|---|---|---|---|---|
| 10,991,774 | B2 * | 4/2021 | Sung | G02B 5/3025 |
| 11,818,940 | B2 * | 11/2023 | Sung | H10K 59/8731 |
| 2019/0252475 | A1 * | 8/2019 | Sung | G02B 5/3025 |
| 2021/0005683 | A1 * | 1/2021 | Sung | H10K 59/123 |

FOREIGN PATENT DOCUMENTS

| | | |
|---|---|---|
| KR | 20220018411 A | 2/2022 |
| KR | 20220073115 A | 6/2022 |

* cited by examiner

*Primary Examiner* — Nikolay K Yushin
(74) *Attorney, Agent, or Firm* — Seed Intellectual Property Law Group LLP

(57) ABSTRACT

Embodiments disclose a display device including a substrate including a display area, a light-transmitting area, a non-display area adjacent to the light-transmitting area, and a first opening that is disposed at a position corresponding to the light-transmitting area. The display device includes a circuit portion and a light-emitting element portion that are disposed in the display area. The display device includes a conductive pattern disposed in the non-display area. The display device includes an etch stop pattern disposed in the non-display area. The display device includes a first coating layer disposed in the first opening and having conductivity. The conductive pattern is electrically connected to the first coating layer. The substrate includes a glass substrate.

23 Claims, 23 Drawing Sheets

DISPLAY DEVICE

CROSS-REFERENCE TO RELATED APPLICATION

This application claims priority to and the benefit of Korean Patent Applications No. 10-2022-0166366, filed on Dec. 2, 2022, and No. 10-2023-0117801, filed on Sep. 5, 2023, the disclosure of which is incorporated herein by reference in its entirety.

BACKGROUND

Technical Field

Embodiments relate to a display device.

Description of the Related Art

Electroluminescence display devices are classified into inorganic light-emitting display devices and organic light-emitting display devices depending on materials of an emission layer. An active-matrix-type organic light-emitting display device includes an organic light-emitting diode (OLED) that emits light by itself and has advantages of a quick response time, high luminous efficiency, high luminance, and a wide viewing angle. The organic light-emitting display device has OLEDs formed in each pixel. The organic light-emitting display device not only has a quick response time, high luminous efficiency, high luminance, and a wide viewing angle, but also represents a black grayscale as perfect black, and thus has an excellent contrast ratio and color gamut.

BRIEF SUMMARY

Recently, organic light-emitting display devices have been implemented on a plastic substrate, which is a flexible material. The inventors of the present disclosure have appreciated that there are some benefits to have the display devices implemented on a glass substrate due to various issues. However, the inventors have also recognized that when the organic light-emitting display devices are implemented on the glass substrates, there is a technical problem that rigidity is reduced when processing notches or rounds or forming holes in a panel and it is difficult to process various shapes. Various embodiments of the present disclosure provide display devices addressing the various technical problems in the related art including the above-identified problem.

For example, embodiments provide a display device allowing static electricity generated around a camera to be removed.

Embodiments provide a display device that maintains rigidity while processing a glass substrate and forming holes of various shapes.

It should be noted that objects of the present disclosure are not limited to the above-described object, and other objects of the present disclosure will be apparent to those skilled in the art from the following descriptions.

According to an aspect of the present disclosure, there is provided a display device including a glass substrate including a display area, a light-transmitting area, a non-display area surrounding the light-transmitting area, and a first opening that is disposed at a position corresponding to the light-transmitting area, a circuit portion and a light-emitting element portion that are disposed in the display area, a conductive pattern disposed in the non-display area, an etch stop pattern disposed in the non-display area, and a first coating layer disposed in the first opening and made of a conductive material, wherein the conductive pattern is electrically connected to the first coating layer.

According to another aspect of the present disclosure, there is provided a display device including a glass substrate including a display area, a light-transmitting area, and a non-display area surrounding the light-transmitting area, and further including a first opening disposed at a position corresponding to the light-transmitting area, a circuit portion and a light-emitting element portion that are disposed in the display area, an etch stop pattern disposed in the non-display area, a first coating layer disposed on a side surface of the first opening, and a second coating layer disposed on a lower surface of the glass substrate and a lower surface of the first coating layer, wherein the first coating layer and the second coating layer include a conductive material and are electrically connected to each other.

BRIEF DESCRIPTION OF THE SEVERAL VIEWS OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION

Figure 1:
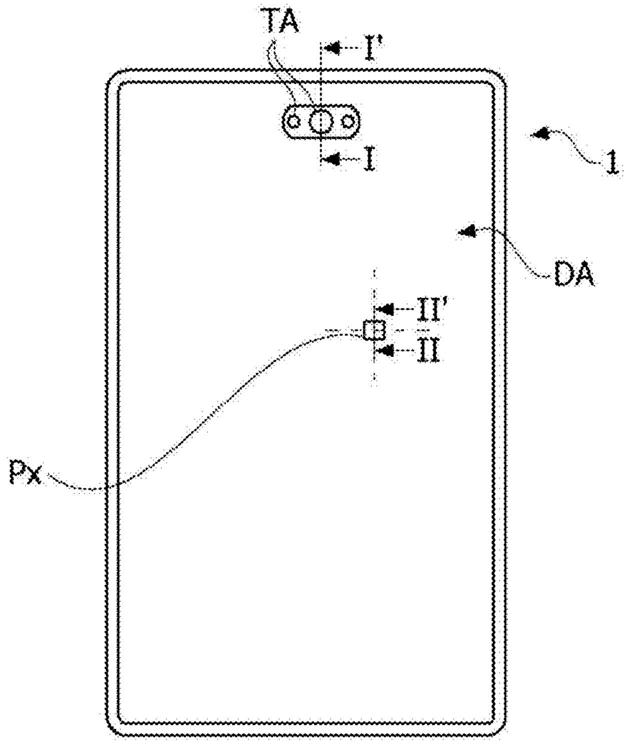
FIG. 1 is a conceptual diagram of a display device according to one embodiment of the present disclosure.

Advantages and features of the present disclosure and implementation methods thereof will be clarified through the following embodiments described with reference to the accompanying drawings. The present disclosure is not limited to the embodiments described below and may be implemented with a variety of different modifications. The embodiments are merely provided to allow those skilled in the art to completely understand the scope of the present disclosure.

The figures, dimensions, ratios, angles, numbers, and the like disclosed in the drawings for describing the embodiments of the present disclosure are merely illustrative and thus the present disclosure is not limited to matters illustrated in the drawings. Throughout the specification, like reference numerals refer to substantially like components. Further, in describing the present disclosure, detailed descriptions of well-known technologies will be omitted when it is determined that they may unnecessarily obscure the gist of the present disclosure.

Terms such as "including," "having," and "composed of" used herein are intended to allow other elements to be added unless the terms are used with the term "only." When a component is expressed in the singular form, it may be construed as the plural form unless otherwise explicitly stated.

Components are interpreted to include an ordinary error range even if not expressly stated.

When the positional or interconnected relationship between two components is described using the terms such as "on," "above," "below," "next to," "connect or couple," "crossing or intersecting," and the like, one or more other components may be interposed between the two components unless the terms are used with the term "immediately" or "directly."

When the temporal order relationship is described using the terms such as "after," "subsequent to," "next," "before," and the like, a case which is not continuous may be included unless the term "immediately" or "directly" is used.

To distinguish between components, ordinal numbers such as first, second, and the like may be used before the name of the component, but the function or structure is not limited by these ordinal numbers or component names. For convenience of description, different embodiments may have different ordinal numbers preceding the names of the same component.

The following embodiments may be partially or entirely coupled to or combined with each other and may be interoperated and performed in technically various ways. Each of the embodiments may be independently operable with respect to each other and may be implemented together in related relationships.

Hereinafter, various embodiments of the present disclosure will be described in detail with reference to the accompanying drawings.

Figure 2:
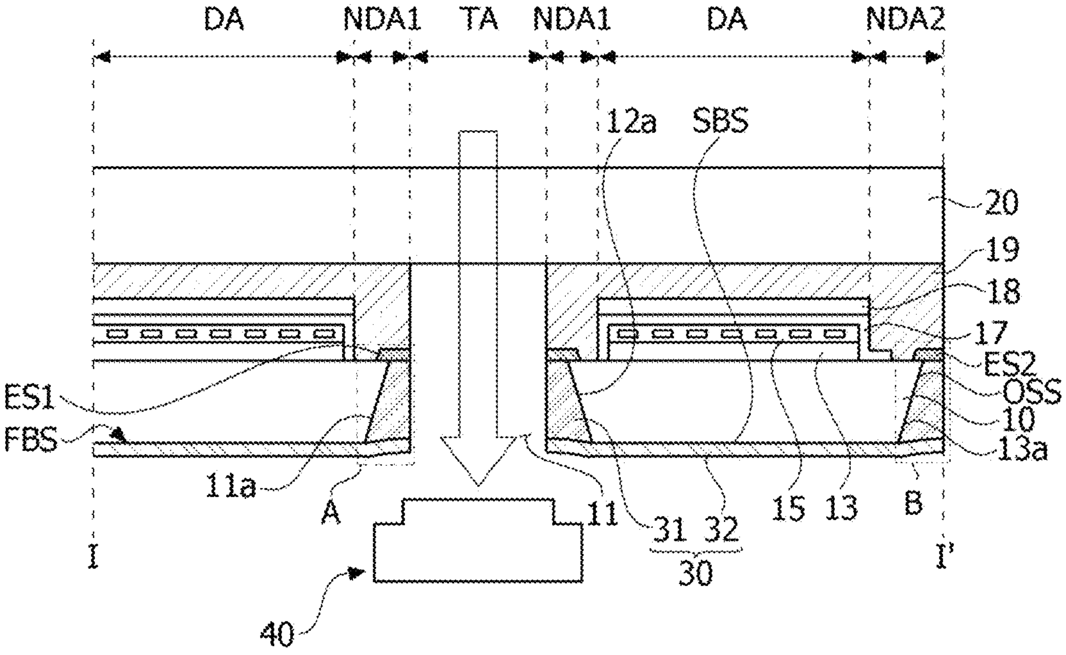
FIG. 2 is a cross-sectional view taken along line I-I' of FIG. 1.
Figure 3:
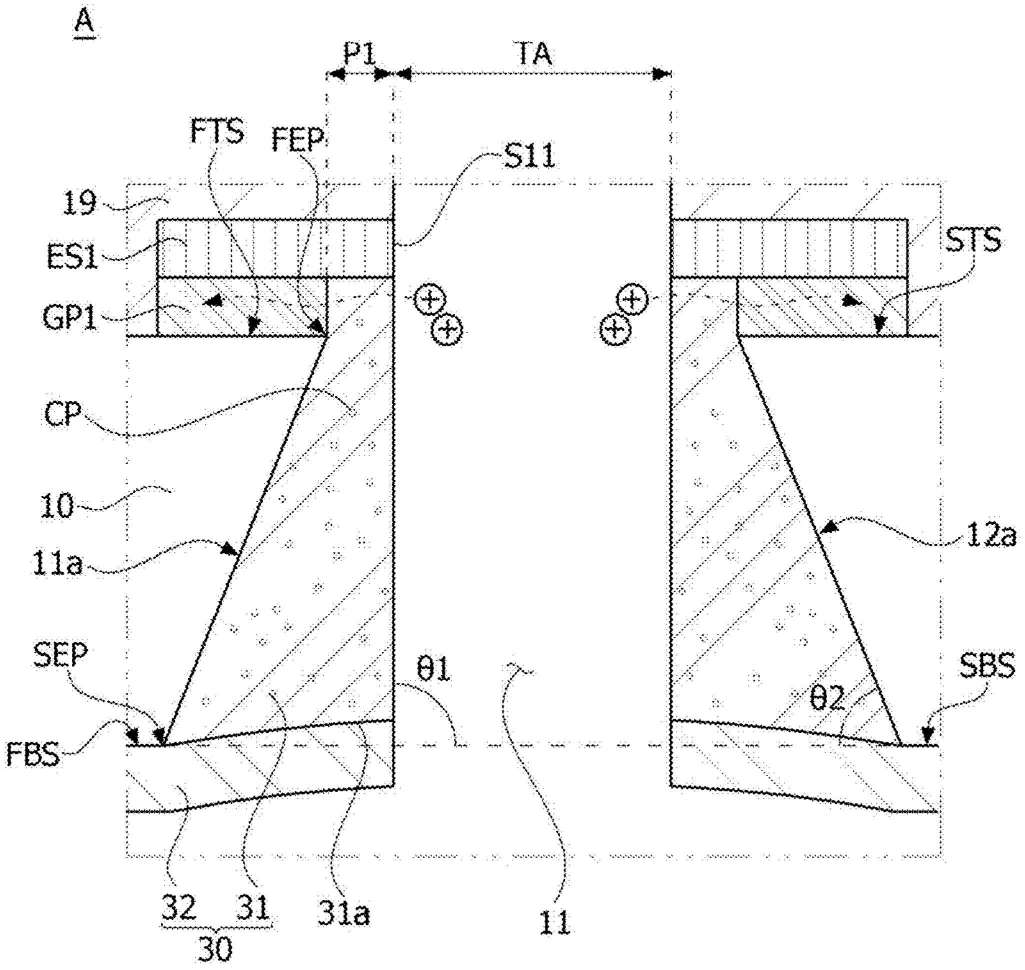
FIG. 3 is an enlarged view of portion A of FIG. 2.
Figure 4:
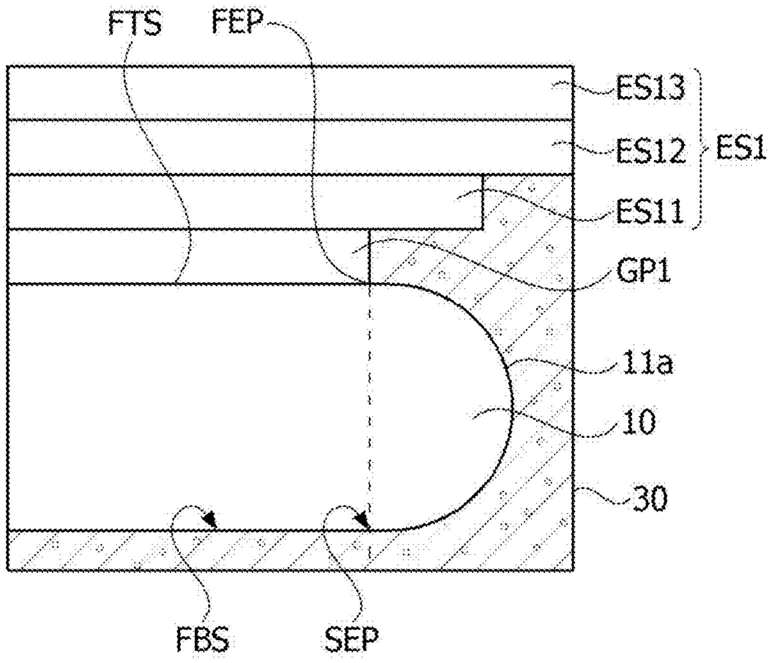
FIG. 4 is a modified example of FIG. 3.

FIG. 1 is a conceptual diagram of a display device according to one embodiment of the present disclosure. FIG. 2 is a cross-sectional view taken along line I-I' of FIG. 1. FIG. 3 is an enlarged view of portion A of FIG. 2. FIG. 4 is a modified example of FIG. 3.

Referring to FIGS. 1 and 2, a display device 1 may include a display area DA from which an image is output and a light-transmitting area TA through which light is incident. The light-transmitting area TA may have a hole structure for allowing light to be incident on a sensor 40 disposed below a display panel, but the present disclosure is not necessarily limited thereto.

The display panel may include a circuit portion 13 disposed on a substrate 10, and a light-emitting element portion 15 disposed on the circuit portion 13. A polarizing plate 19 may be disposed on the light-emitting element portion 15, and a cover glass 20 may be disposed on the polarizing plate 19. In addition, a touch portion 18 may be disposed between the light-emitting element portion 15 and the polarizing plate 19.

According to the embodiment, the substrate 10 may be a glass substrate having a selected (or predetermined) strength. However, the substrate 10 is not necessarily limited thereto, may include a flexible material such as polyimide.

The circuit portion 13 may include a pixel circuit connected to wirings such as data lines, gate lines, power lines, and the like, a gate driving portion connected to the gate lines, and the like.

The circuit portion 13 may include circuit elements such as a transistor implemented as a thin-film transistor (TFT), a capacitor, and the like. The wirings and circuit elements of the circuit portion 13 may be implemented with a plurality of insulating layers, two or more metal layers separated from each other with the insulating layers therebetween, and an active layer including a semiconductor material.

The light-emitting element portion 15 may have a device structure such as an organic light-emitting diode (OLED) display, a quantum dot display, a micro light-emitting diode (LED) display, or the like. Hereinafter, an OLED structure including an organic compound layer will be described as an example.

The organic compound layer may include a hole injection layer HIL, a hole transport layer HTL, an emission layer EML, an electron transport layer ETL, and an electron injection layer EIL, but the present disclosure is not limited thereto.

When a voltage is applied to an anode and a cathode of an OLED, holes passing through the hole transport layer HTL and electrons passing through the electron transport layer ETL move to the emission layer EML to create excitons, and thus visible light may be emitted from the emission layer EML.

The light-emitting element portion 15 may further include a color filter array disposed on pixels that selectively transmit light of red, green, and blue wavelengths.

The light-emitting element portion 15 may be covered by a protective film, and the protective film may be covered by an encapsulation portion 17. The protective film and the encapsulation portion 17 may have a structure in which organic insulating layers and inorganic insulating layers are alternately stacked. The inorganic insulating layer may block the penetration of moisture or oxygen. The organic insulating layer may planarize a surface of the inorganic insulating layer. Thus, when the organic and inorganic insulating layers are stacked in multiple layers, a moving path of the moisture or oxygen is longer compared to a single layer, so that the penetration of moisture/oxygen affecting the light-emitting element portion 15 may be effectively blocked.

The polarizing plate 19 may be disposed on the light-emitting element portion 15. The polarizing plate 19 can improve outdoor visibility of the display device. The polarizing plate 19 may reduce light reflected from a surface of the display panel and block light reflected from the metal of the circuit portion 13 to improve the brightness of the pixels.

The light-transmitting area TA may be formed in a portion of the display area DA. A first non-display area NDA1 may be disposed to surround the light-transmitting area TA. The first non-display area NDA1 may include a structure of a plurality of dams to protect light-emitting elements in the display area DA from moisture or oxygen that may be introduced from the light-transmitting area TA.

The light-transmitting area TA may have a through-hole structure for injecting light into the sensor 40 such as a camera. However, the present disclosure is not necessarily limited thereto, and pixels having a low density may be disposed in the light-transmitting area TA.

The substrate 10 may include a first opening 11 disposed in the light-transmitting area TA. The first opening 11 may have a tapered shape that narrows in width as it approaches the cover glass 20. However, the first opening 11 is not necessarily limited thereto, and may have a tapered shape that increases in width as it approaches the cover glass 20, or may be constant in width in a thickness direction. The tapered shape of the first opening 11 may be variously changed by the type of an etching solution and an etching method.

A first etch stop pattern ES1 may be disposed on the first opening 11 of the substrate 10. In addition, a second etch stop pattern ES2 may be disposed on an edge of the substrate 10. The first etch stop pattern ES1 and the second etch stop pattern ES2 may prevent an etching solution from penetrating into the panel when etching the substrate 10.

The first etch stop pattern ES1 and the second etch stop pattern ES2 may include an organic material that is chemically resistant to an etching solution. Thus, the first etch stop pattern ES1 and the second etch stop pattern ES2 may not be substantially etched by the etching solution. As an example, the etch stop pattern may include one selected from the group consisting of a polyester-based polymer, a silicone-based polymer, an acrylic-based polymer, a polyolefin-based polymer, and a copolymer thereof. However, the etch stop pattern is not necessarily limited thereto, and may include various materials that are resistant to the etching solution.

The first etch stop pattern ES1 and the second etch stop pattern ES2 may be formed using at least one of the layers constituting the circuit portion 13, the light-emitting element portion 15, the encapsulation portion 17, and the touch portion 18. That is, the first etch stop pattern ES1 and the second etch stop pattern ES2 may be dummy layers simultaneously formed when forming the circuit portion 13, the light-emitting element portion 15, the encapsulation portion 17, or the touch portion 18. With this configuration, the etch stop pattern may be formed without adding a separate process.

Referring to FIG. 3, the first etch stop pattern ES1 may include a protrusion P1 protruding toward an inner side (e.g., S11) of the first opening 11. The protrusion P1 may be defined as a portion more protruding toward an inner side of the light-transmitting area TA than an upper surface of the first opening 11.

A coating layer 30 may be formed on a side surface 11*a* and a back surface BS of the substrate 10. For example, the coating layer 30 may be formed of an organic material including a polyester-based polymer or an acrylic-based polymer.

The coating layer 30 may include a side coating layer 31 formed in the first opening 11, and a back coating layer 32 disposed on a lower portion of the substrate. A lower surface 31*a* of the side coating layer 31 may be formed to be concave toward the first etch stop pattern ES1.

The side coating layer 31 may be made of an organic material that absorbs light. In one embodiment, the side coating layer 31 may include an organic material having an optical density (OD) of 1.0 or more.

According to the embodiment, the side coating layer 31 may include a conductive material. As an example, the side coating layer 31 may be made with conductive particles CP dispersed therein to allow electricity to flow. The conductive particles CP are not particularly limited as long as the conductive particles CP are made of a conductive material. As an example, the conductive particles CP may be any one of indium-tin-oxide (ITO) nanoparticles, indium-zinc-oxide (IZO) nanoparticles, conductive polymers, and silver (Ag) nanowires.

However, the present disclosure is not necessarily limited thereto, and the side coating layer 31 can be made of a material that is conductive in itself without separate conductive particles. As an example, the side coating layer 31 may be a conductive polymer. As an example, the conductive polymer may be one of polyaniline, polythiophene, poly(3,4-ethylenedioxythiophene) (PEDOT), and polypyrrole, but the present disclosure is not necessarily limited thereto.

In a process of assembling a display panel to a camera, static electricity may be generated for various reasons (e.g., friction force due to assembly tolerances). This static electricity degrades the performance of the camera and thus it is beneficial to have the static electricity quickly removed.

According to the embodiment, since the light-transmitting area TA in which the camera is assembled is surrounded by the side coating layer 31 having conductivity, static electricity (exemplified by positive charges) generated in the light-transmitting area can move to a conductive pattern GP1 through the side coating layer 31. The conductive pattern GP1 may be connected to various lines or a ground inside the panel. Accordingly, the static electricity adsorbed on the side coating layer 31 can be quickly removed from the light-transmitting area.

A first inclined surface 11*a* of the first opening 11 and a side surface S11 of the protrusion P1 of the first etch stop layer may have different inclinations. As an example, an inclination angle θ1 of the side surface S11 of the protrusion P1 may be greater than an inclination angle θ2 of the first inclined surface 11*a*. This is because the first opening 11 is etched by an etching solution and has a tapered shape, while the first etch stop pattern ES1 is cut by a laser to form a relatively vertical cross section. A side surface S21 of the coating layer 30 disposed below the protrusion P1 may have the same inclination angle as the side surface S11 of the protrusion P1.

As shown in FIG. 3, on the left side of the first opening 11, the substrate 10 has a first top surface FTS, a first inclined surface 11*a*, and a first bottom surface FBS. The first inclined surface 11*a* is between the first top surface FTS and the first bottom surface FBS. The first inclined surface 11*a* and the first top surface FTS meets at a first end point FEP. Here, at the first end point FEP, the two surfaces, e.g., the first inclined surface 11*a* and the first top surface FTS contact each other. Similarly, the first inclined surface 11*a* and the first bottom surface FBS meets at a second end point SEP. Here, at the second end point SEP, the two surfaces, e.g., the first inclined surface 11*a* and the first bottom surface FBS contact each other.

As shown, the conductive pattern GP1 protrudes towards the first opening 11. However, in some embodiments, the conductive pattern GP1 do not extend beyond the first end point FEP. However, the first etch stop pattern ES1 includes the protrusion P1 that extends towards the first opening 11 and further extends beyond the first end point FEP.

A second inclined surface 12*a* is on the opposite side of the first inclined surface 11. The first opening 11 is between the second inclined surface 12*a* and the first inclined surface 11.

As shown in FIG. 3, on the right side of the first opening 11, the substrate 10 has a second top surface STS, a second inclined surface 12*a*, and a second bottom surface SBS. The second inclined surface 12*a* is between the second top surface STS and the second bottom surface SBS.

However, the present disclosure is not necessarily limited thereto, and the first inclined surface 11*a* may have the same as an inclination of the side surface of the first etch stop pattern ES1. Alternatively, the first inclined surface 11*a* may have a rounded shape (see FIG. 4).

Referring to FIG. 4, the first etch stop pattern ES1 may include a plurality of etch stop patterns ES11, ES12, and ES13. Each of the plurality of etch stop patterns ES11, ES12, and ES13 may be formed as an organic insulating layer, but the present disclosure is not necessarily limited thereto.

As an example, a first etch stop layer ES11 may be an inorganic insulating layer, and a third etch stop layer ES13 may be an organic insulating layer. Since an adhesion between the organic insulating layer and the substrate 10 is relatively weak, the adhesion between the organic insulating layer and the substrate 10 may be improved by the inorganic insulating layer. The inorganic insulating layer may be etched when the inorganic insulating layer is in contact with an etching solution.

A second etch stop layer ES12 may be a metal layer. The second etch stop layer ES12 may include molybdenum (Mo) or the like, which has relatively greater chemical resistance to an etching solution as compared to the first etch stop layer ES11. However, the present disclosure is not necessarily limited thereto, and the second etch stop layer ES12 may be omitted in some cases.

The conductive pattern GPI may be disposed between the substrate 10 and the first etch stop pattern ES1. The conductive pattern GP1 may be formed of a single layer, but is not necessarily limited thereto, and may be formed of a plurality of metal layers.

The first opening 11 may be entirely filled with the coating layer 30. Accordingly, when the first etch stop pattern ES1 is cut by a laser, the coating layer 30 formed in the first opening 11 may be cut to have the same cross section as the first etch stop pattern ES1. Thus, the cross section of the first etch stop pattern ES1 and the cross section of the coating layer 30 formed in the first opening 11 may be coplanar with each other.

In the substrate 10, the first inclined surface 11*a* may have a rounded shape rather than a tapered shape. As such, the first inclined surface 11*a* may have various shapes by adjusting an etching solution and an etching method.

Figure 5:
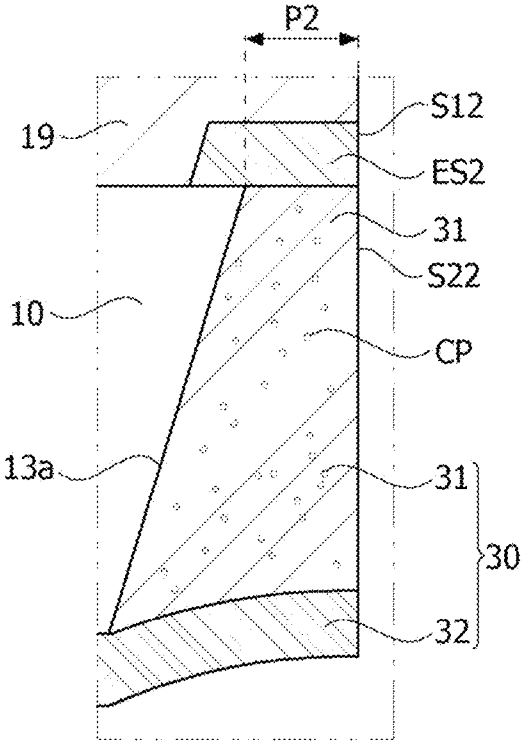
FIG. 5 is an enlarged view of portion B of FIG. 2.

Referring to FIGS. 2 and 5, a second non-display area NDA2 may be disposed at an edge of the display panel. The second non-display area NDA2 may be a margin portion required to separate a plurality of panels from a mother substrate.

The substrate 10 may include a third inclined surface 13*a* formed at the edge thereof. In some embodiments, the third inclined surface 13*a* may have the same angle as the first inclined surface 11*a* formed in the first opening 11. In some embodiments, the second inclined surface 12*a* may have the same angle as the first inclined surface 11*a* formed in the first opening 11. The first opening 11 and the second inclined surface 12*a* are formed simultaneously by an etching solution, so that the first opening 11 and the second inclined surface 12*a* may have the same inclination angle and etching depth. In some embodiments, the first opening 11 and the third inclined surface 13*a* are formed simultaneously by an etching solution, so that the first opening 11 and the third inclined surface 13*a* may have the same inclination angle and etching depth.

According to the embodiment, the first opening 11 may be formed in the substrate 10 of each display panel simultaneously in a process of separating a plurality of display panels by etching a mother substrate using an etching solution. Accordingly, the opening may be formed without additional equipment and without reducing rigidity. In addition, various shapes of openings may be formed by changing a mask pattern.

The second etch stop pattern ES2 disposed in the second non-display area NDA2 may prevent an etching solution from penetrating into a plurality of display panels when etching a mother substrate to separate the plurality of display panels.

Alternatively, the second etch stop pattern ES2 may be simultaneously formed when forming at least one of the circuit portion 13, the light-emitting element portion 15, the encapsulation portion 17, and the touch portion 18. With this configuration, the second etch stop pattern ES2 may be formed without adding a separate process.

According to the embodiment, the second etch stop pattern ES2 may include a protrusion P2 protruding outwardly from the third inclined surface 13*a*. The protrusion P2 may prevent damage to the display panel when laser cutting the second etch stop pattern ES2. A side surface S22 of the coating layer 30 disposed below the protrusion P2 may have the same inclination angle as a side surface S12 of the protrusion P2.

Figure 6:
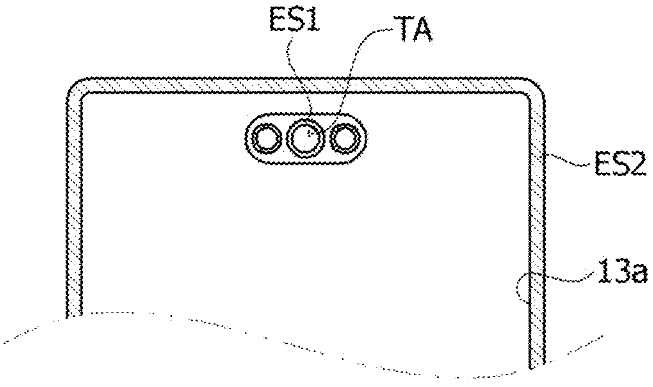
FIG. 6 is a view illustrating an etch stop pattern surrounding a light-transmitting area and an edge area of a substrate.

FIG. 6 is a view illustrating a shape in which the etch stop layer surrounds the light-transmitting area.

Referring to FIG. 6, the first etch stop pattern ES1 may be disposed to entirely surround the periphery of the light-transmitting area TA. In addition, the second etch stop pattern ES2 may be disposed to entirely surround the third inclined surface 13*a* which is an outermost side surface OSS of the substrate 10 (or an outermost side surface OSS of the display panel).

In some embodiments, the second etch stop pattern ES2 is adjacent to the outermost side surface OSS of the substrate 10. Here, the second etch stop pattern ES2 is formed along the outermost side surface OSS of the substrate 10 such that the second etch stop ES2 pattern entirely surrounds the substrate 10 as shown in FIG. 6.

According to the embodiment, since the first etch stop pattern ES1 is disposed to entirely surround the periphery of the light-transmitting area TA and the second etch stop pattern ES2 is disposed to entirely surround an outer circumferential surface of the display panel, an etching solution may be prevented from penetrating into the panel in a case in which an opening is formed inside the substrate 10 simultaneously when a mother substrate is cut.

According to the embodiment, an opening of various shapes may be formed in the substrate 10 by using etching. Thus, compared to conventional scribing, breaking, and grinding techniques, there is an advantage of being able to form various openings while maintaining the rigidity of the substrate 10.

In addition, there is an advantage of being able to form the opening simultaneously when processing the side surface of the substrate 10 to form notches or roundings on the side surface of the substrate 10.

Figure 7:
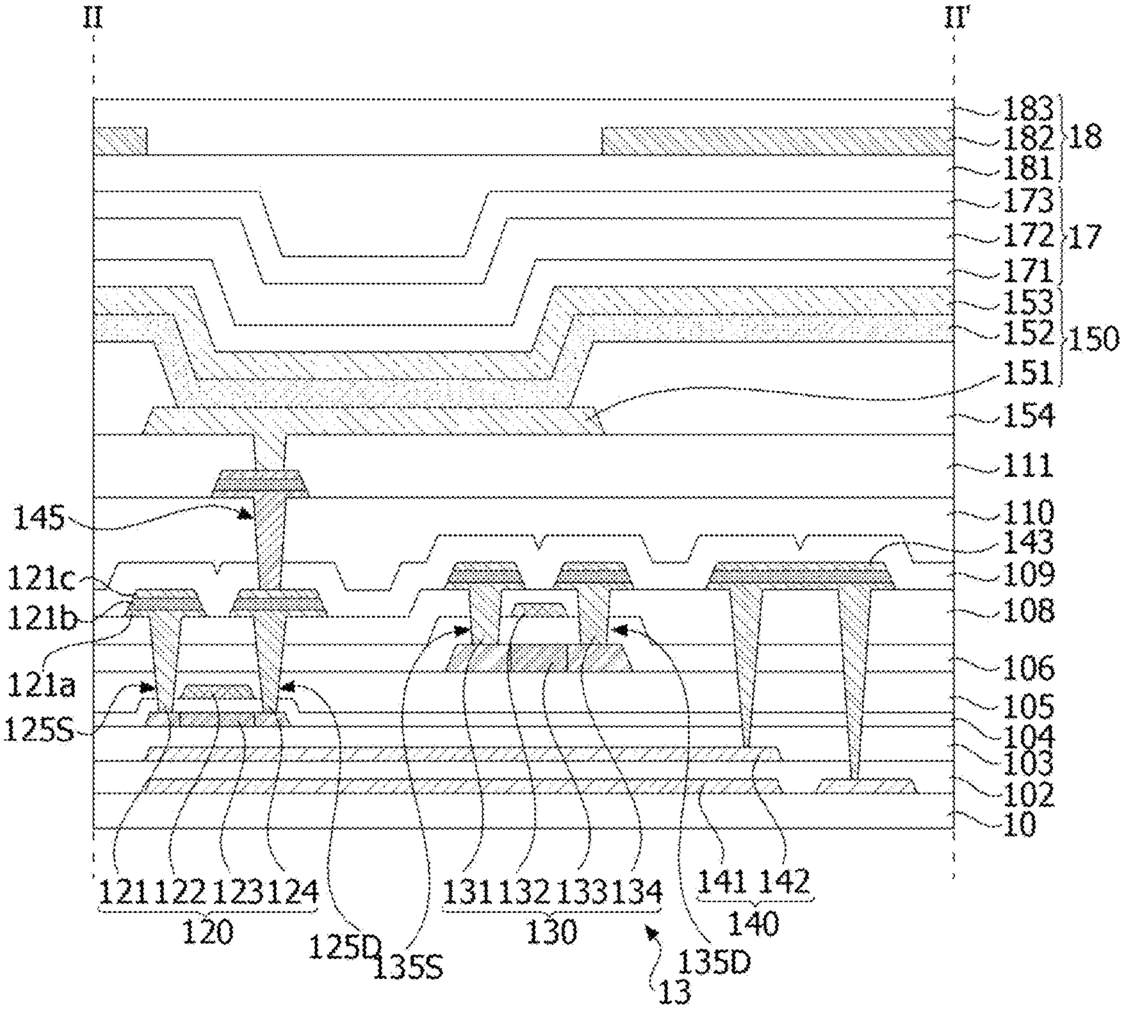
FIG. 7 is a cross-sectional view taken along line II-II' of FIG. 1.

FIG. 7 is a cross-sectional view taken along line II-II' of FIG. 1.

Referring to FIG. 7, in the display area DA, a first transistor 120 and a second transistor 130 may be disposed on the substrate 10, and a light-emitting element portion 150 may be disposed on a planarization layer 111.

A first light-blocking layer 141 may be disposed on the substrate 10. The first light-blocking layer 141 may include molybdenum and/or aluminum. The first light-blocking layer 141 may block light entering a first semiconductor layer 123 or a second semiconductor layer 133.

A multi-buffer layer 102 may delay the diffusion of moisture or oxygen penetrating into the substrate 10, and may be formed by alternately stacking silicon nitride (SiNx) and silicon oxide (SiOx) at least once.

A second light-blocking layer 142 may be disposed on the multi-buffer layer 102. The second light-blocking layer 142 may include molybdenum and/or aluminum. The second light-blocking layer 142 may block light entering the first semiconductor layer 123 or the second semiconductor layer 133.

An active buffer layer 103 may protect the first semiconductor layer 123, and serve to block various types of defects introduced from the substrate 10. The active buffer layer 103 may be formed of a-Si, silicon nitride (SiNx), silicon oxide (SiOx), or the like.

The first semiconductor layer 123 of the first transistor 120 may be formed of a polycrystalline semiconductor layer, and the first semiconductor layer 123 may include a channel area, a source area, and a drain area.

The polycrystalline semiconductor layer has higher mobility than an amorphous semiconductor layer and an oxide semiconductor layer, and thus has low energy power consumption and excellent reliability. Due to these advantages, the polycrystalline semiconductor layer may be used for a driving transistor.

A first gate electrode 122 may be disposed on a lower gate insulating layer 104 and may be disposed to overlap the first semiconductor layer 123.

The second transistor 130 may be disposed on a lower interlayer insulating layer 105. An upper gate insulating layer 106 for insulating a second gate electrode 132 from the second semiconductor layer 133 may be disposed on the second semiconductor layer 133.

An upper interlayer insulating layer 108 may be disposed on the second gate electrode 132. Each of the first gate electrode 122 and the second gate electrode 132 may be formed as a single layer or a multilayer made of one selected from among molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The lower interlayer insulating layer 105 may be formed as an inorganic insulating layer having a higher hydrogen particle content than the upper interlayer insulating layer 108. For example, the lower interlayer insulating layer 105 may be made of silicon nitride (SiNx) formed through a deposition process using $NH_3$ gas, and the upper interlayer insulating layer 108 may be made of silicon oxide (SiOx). Hydrogen particles included in the lower interlayer insulating layer 105 may be diffused into the polycrystalline semiconductor layer during a hydrogenation process to fill pores in the polycrystalline semiconductor layer with hydrogen. Accordingly, the polycrystalline semiconductor layer may be stabilized, thereby preventing degradation in characteristics of the first transistor 120.

After an activation and hydrogenation process of the first semiconductor layer 123 of the first transistor 120, the second semiconductor layer 133 of the second transistor 130 may be formed, and in this case, the second semiconductor layer 133 may be formed of an oxide semiconductor. Since the second semiconductor layer 133 is not exposed to a high-temperature atmosphere of the activation and hydrogenation process of the first semiconductor layer 123, damage to the second semiconductor layer 133 may be prevented, which may improve reliability.

After the upper interlayer insulating layer 108 is disposed, a first source contact hole 125S and a first drain contact hole 125D may be respectively formed to correspond to a source area and a drain area of the first transistor, and a second source contact hole 135S and a second drain contact hole 135D may be respectively formed to correspond to a source region and a drain region of the second transistor 130.

The first source contact hole 125S and the first drain contact hole 125D may be continuously formed from the upper interlayer insulating layer 108 to the lower gate insulating layer 104, and the second source contact hole 135S and the second drain contact hole 135D may also be formed in the second transistor 130.

A first source electrode 121 and a first drain electrode 124 corresponding to the first transistor 120, and a second source electrode 131 and a second drain electrode 134 corresponding to and the second transistor 130 may be simultaneously formed. Through this, it is possible to reduce the number of processes to form source and drain electrodes of each of the first transistor 120 and the second transistor 130.

The first source and drain electrodes 121 and 124 and the second source and drain electrodes 131 and 134 may be formed as a single layer or a multilayer made of one selected from among molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The first source and drain electrodes 121 and 124 and the second source and drain electrodes 131 and 134 may have a three-layered structure, and for example, the first source electrode 121 may include a first layer 121*a* including Ti, a second layer 121*b* including Al, and a third layer 121*c* including Ti, and other source and drain electrodes may have the same structure as the first source electrode 121.

A storage capacitor 140 may be disposed between the first transistor 120 and the second transistor 130. According to the embodiment, the storage capacitor 140 may be formed using the first light-blocking layer 141 and the second light-blocking layer 142. As an example, the second light-blocking layer 142 may be electrically connected to a pixel circuit through a storage supply line 143. However, the structure of the storage capacitor 140 is not necessarily limited thereto, and may be variously modified using other two metal layers.

The storage supply line 143 may be formed to be coplanar with the first source and drain electrodes 121 and 124 and the second source and drain electrodes 131 and 134 and made of the same material as the first source and drain electrodes 121 and 124 and the second source and drain electrodes 131 and 134, and accordingly, the storage supply line 143 may be formed simultaneously with the first source and drain electrodes 121 and 124 and the second source and drain electrodes 131 and 134 through the same mask process.

A protective film 109 may be formed by depositing an inorganic insulating material such as SiNx or SiOx on an entire surface of the substrate 10 on which the first source and drain electrodes 121 and 124, the second source and drain electrodes 131 and 134, and the storage supply line 143 are formed.

A first planarization layer 110 may be formed on the protective film 109. Specifically, the first planarization layer 110 may be disposed by applying an organic insulating material such as an acrylic-based resin onto the entire surface of the protective film 109.

After the protective film 109 and the first planarization layer 110 are disposed, a contact hole exposing the first source electrode 121 or the first drain electrode 124 of the first transistor 120 may be formed through a photolithography process. A connection electrode 145 made of a material including Mo, Ti, Cu, AlNd, Al, Cr, or an alloy thereof may be disposed in an area of the contact hole exposing the first drain electrode 124.

A second planarization layer 111 may be disposed on the connection electrode 145, and a contact hole exposing the connection electrode 145 may be formed in the second planarization layer 111 to arrange a light-emitting element 150 connected to the first transistor 120. The connection electrode 145 may have a multi-layer structure in the same manner as the first source and drain electrodes 121 and 124.

The light-emitting element 150 may include an anode 151 connected to the first drain electrode 124 of the first transistor 120, at least one light-emitting stack 152 formed on the anode 151, and a cathode 153 formed on the light-emitting stack 152.

The light-emitting stack 152 may include a hole injection layer, a hole transport layer, an emission layer, an electron transport layer, and an electron injection layer, and in a tandem structure in which a plurality of emission layers overlap each other, a charge generation layer may be additionally disposed between the emission layer and the emission layer. The emission layers may emit different colors for respective sub-pixels.

The anode 151 may be connected to the connection electrode 145 exposed through the contact hole passing through the second planarization layer 111. The anode 151 may be formed in a multi-layer structure including a transparent conductive film and an opaque conductive film having high reflective efficiency. The transparent conductive film may be made of a material with a relatively large work function value, such as indium-tin-oxide (ITO) or indium-zinc-oxide (IZO), and the opaque conductive film may be formed of a single-layer or multi-layer structure containing Al, Ag, Cu, Pb, Mo, Ti, or an alloy thereof.

For example, the anode 151 may be formed in a structure in which a transparent conductive film, an opaque conductive film, and a transparent conductive film are sequentially stacked, or a transparent conductive film and an opaque conductive film are sequentially stacked.

The anode 151 may be disposed in an emission region provided by a bank 154 as well as on the second planarization layer 111 to overlap a pixel circuit region in which the first and second transistors 120 and 130 and the storage capacitor 140 are disposed, thereby increasing an area for emitting light.

The light-emitting stack 152 may be formed by stacking a hole transport layer, an organic emission layer, and an electron transport layer on the anode 151 in this order or in a reverse order. Additionally, the light-emitting stack 152 may further include a charge generation layer and may include first and second light-emitting stacks facing each other with the charge generation layer therebetween.

The bank 154 may be formed to expose the anode 151. The bank 154 may be made of an organic material such as photoacrylic and may include a translucent material, but the present disclosure is not limited thereto. The bank 154 may be made of an opaque material to prevent light interference between the subpixels.

The cathode 153 may be formed on an upper surface of the light-emitting stack 152 to face the anode 151 with the light-emitting stack 152 interposed therebetween. When the cathode 153 is applied to a top emission type organic light-emitting display device, a transparent conductive film may be formed by thinly forming indium-tin-oxide (ITO), indium-zinc-oxide (IZO), or magnesium-silver (Mg—Ag).

The encapsulation portion 17 for protecting the light-emitting element 150 may be formed on the cathode 153. Since the light-emitting element 150 reacts with external moisture or oxygen due to the characteristics of an organic material of the light-emitting stack 152, dark-spots or pixel shrinkage may occur. In order to prevent the dark-spots or pixel shrinkage, the encapsulation portion 17 may be disposed on the cathode 153.

The encapsulation portion 17 may include a first inorganic insulating layer 171, a foreign material compensation layer 172, and a second inorganic insulating layer 173.

The touch portion 18 may be disposed on the encapsulation portion 17. The touch portion 18 may include a first touch planarization layer 181, a touch electrode 182, and a second touch planarization layer 183. The first touch planarization layer 181 and the second touch planarization layer 183 may be disposed to eliminate a stepped portion at a point at which the touch electrode 182 is disposed and to allow the touch electrode 182 to be electrically insulated well.

According to embodiments, by disposing the first transistor 120 made of low-temperature polycrystalline silicon and the second transistor 130 made of an oxide semiconductor in different layers, thin-film transistors (TFTs) having different driving characteristics can be disposed in the display device 1. However, the present disclosure is not necessarily limited thereto, and only the thin-film transistors having the same driving characteristic may be used and various circuit structures may be provided.

Figure 8:
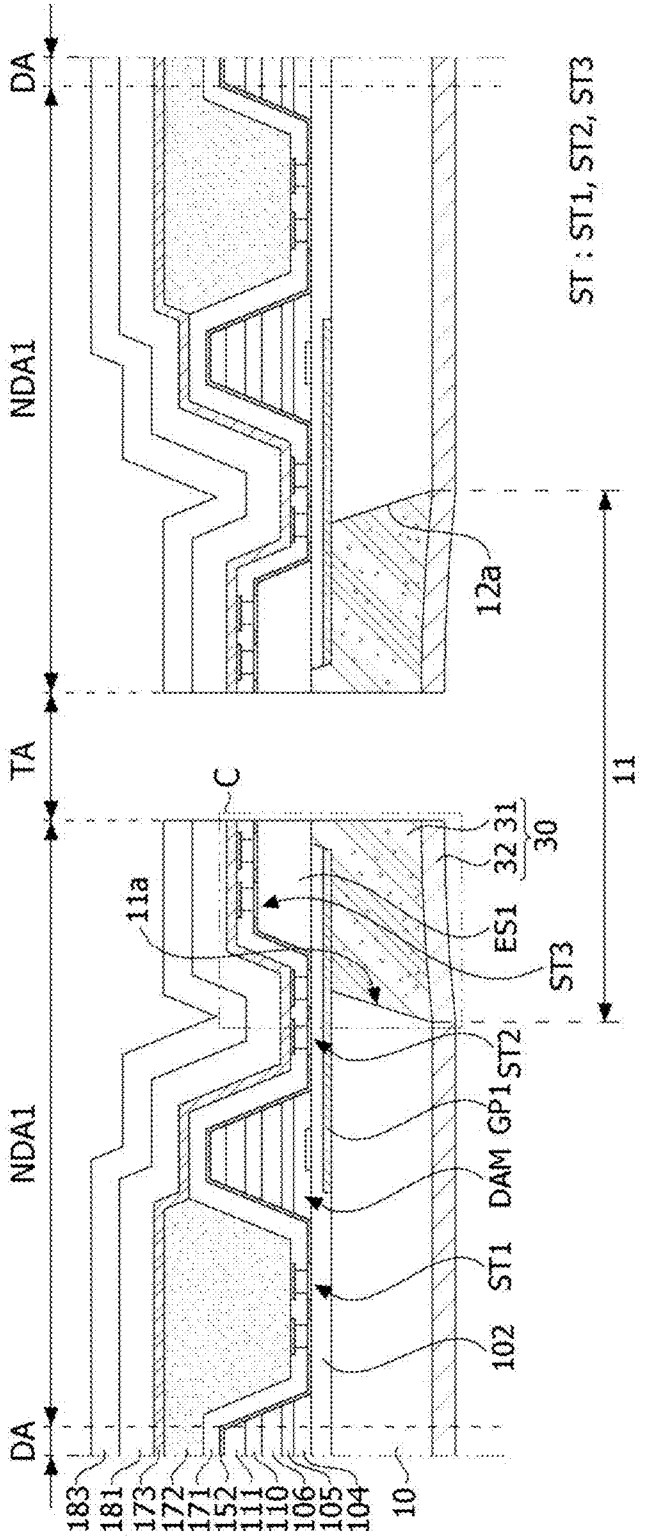
FIG. 8 is a view illustrating a display device according to a first embodiment of the present disclosure.
Figure 9:
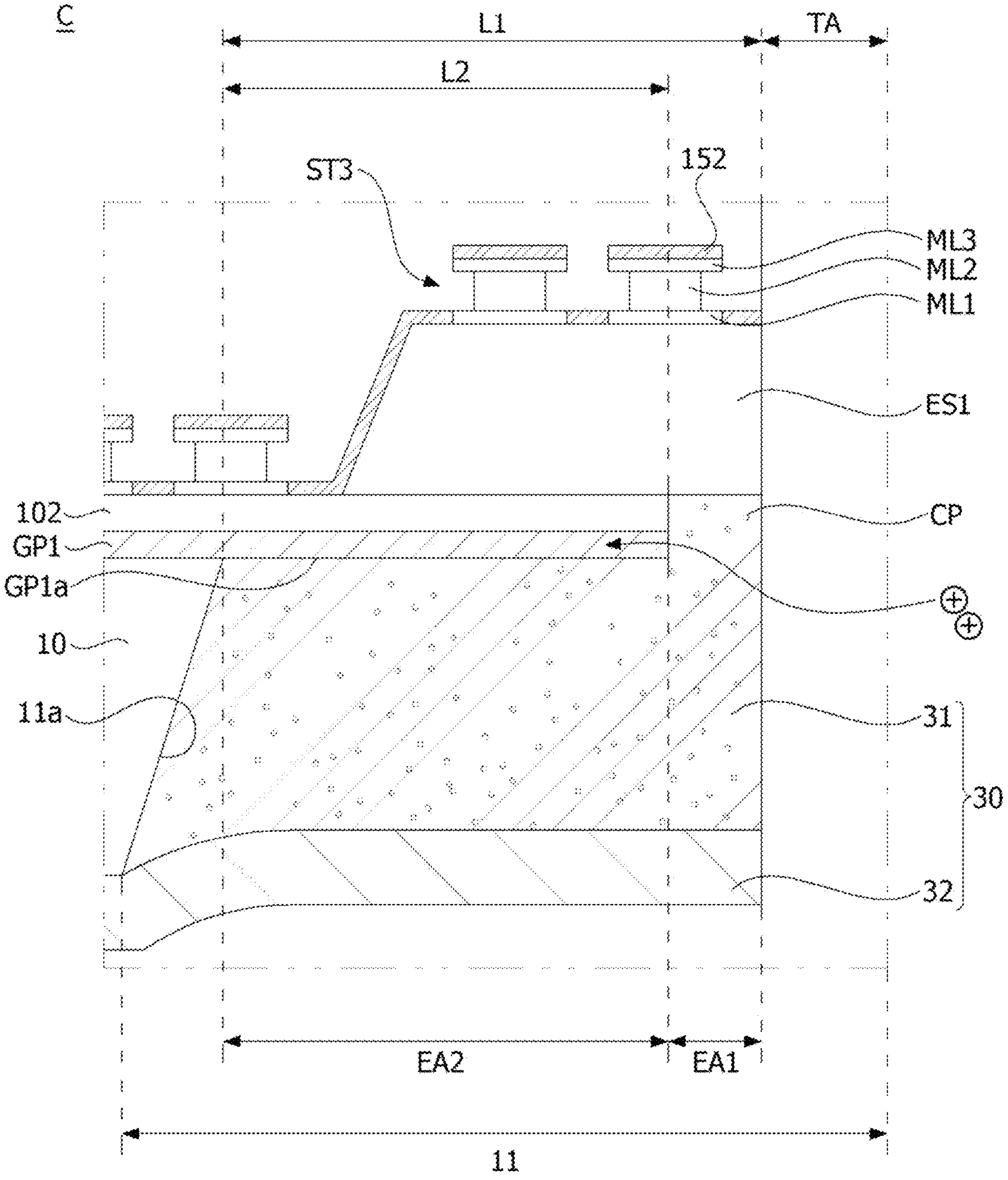
FIG. 9 is an enlarged view of portion C of FIG. 8.
Figure 10:
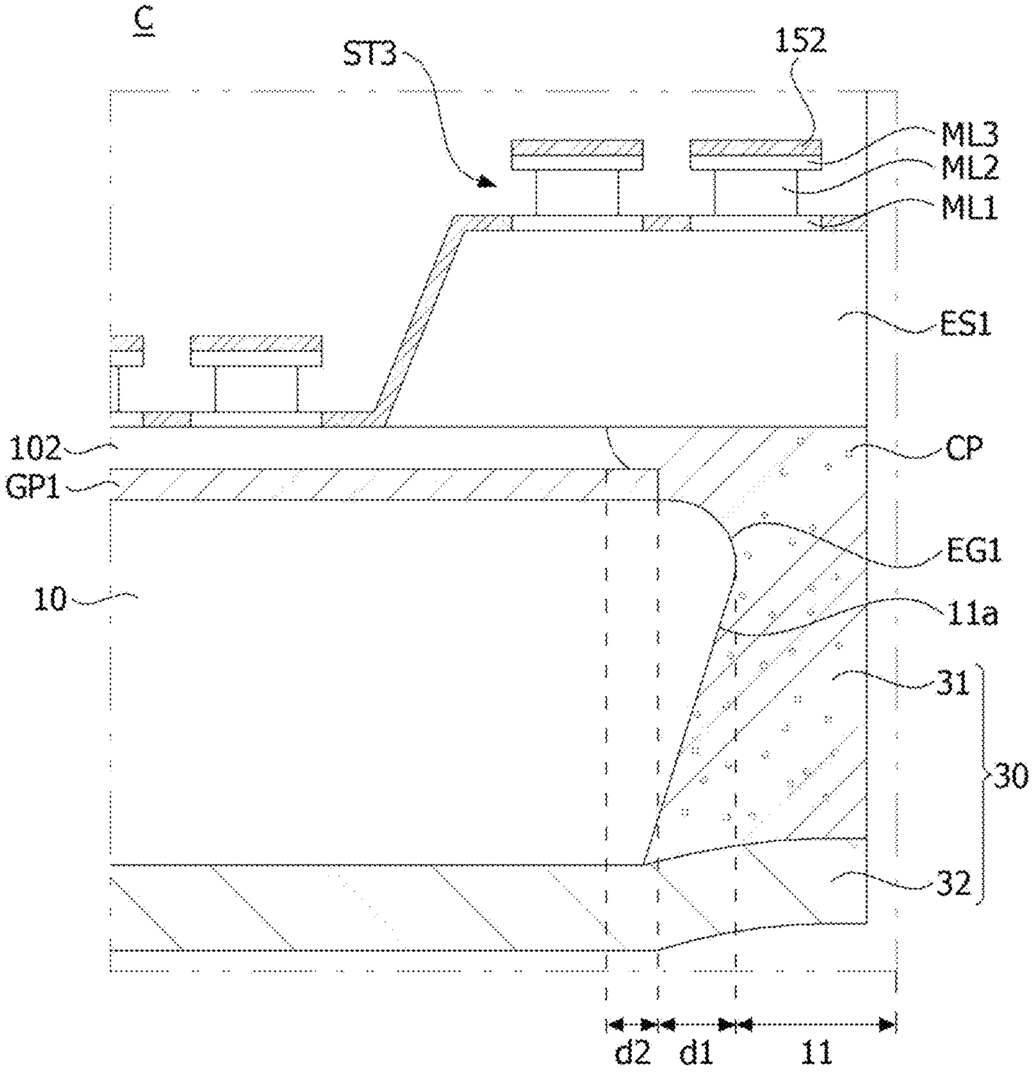
FIG. 10 is a modified example of FIG. 9.
Figure 11A:
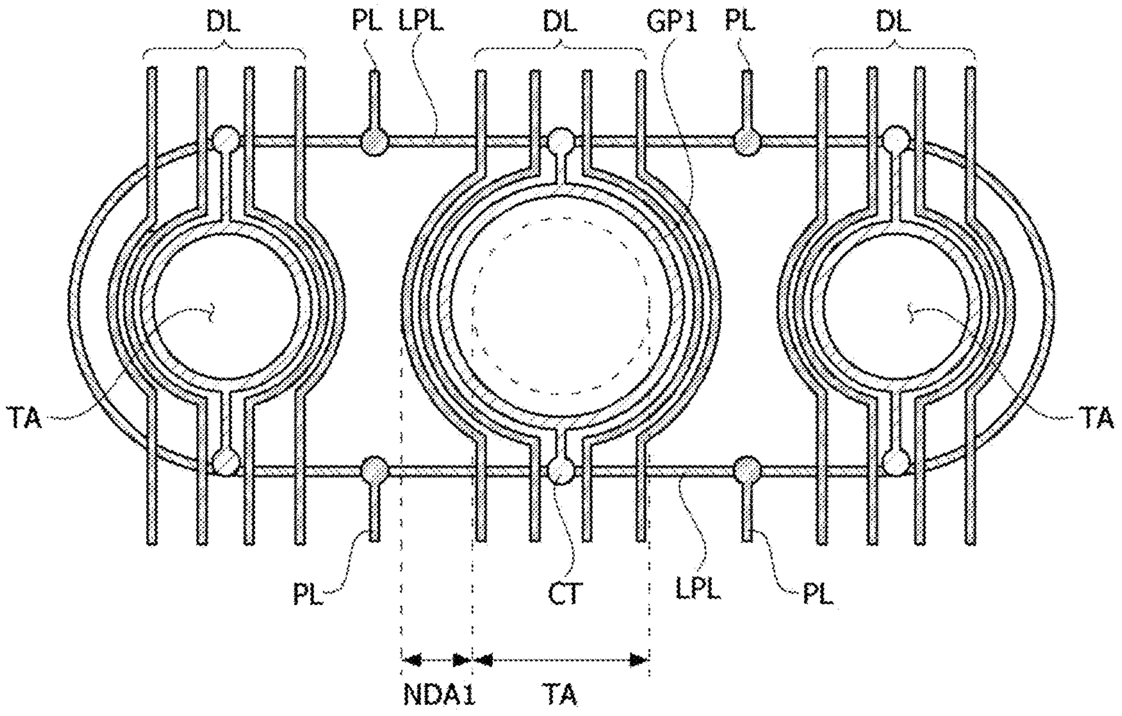
FIG. 11A is a view illustrating a state in which a conductive pattern is connected to a power line.
Figure 11B:
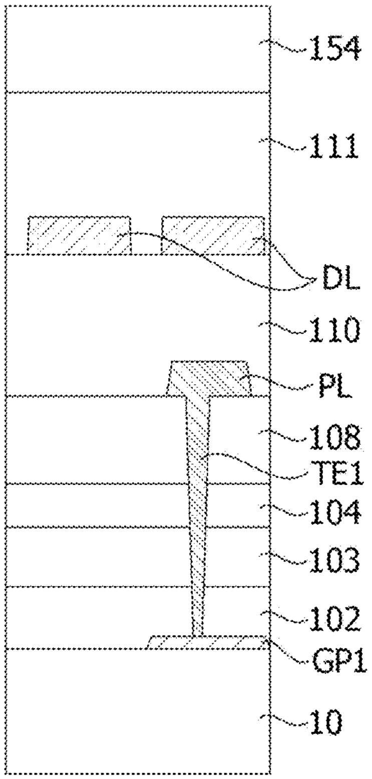
FIG. 11B is a cross-sectional view illustrating a state in which the conductive pattern is connected to the power line.
Figure 11C:
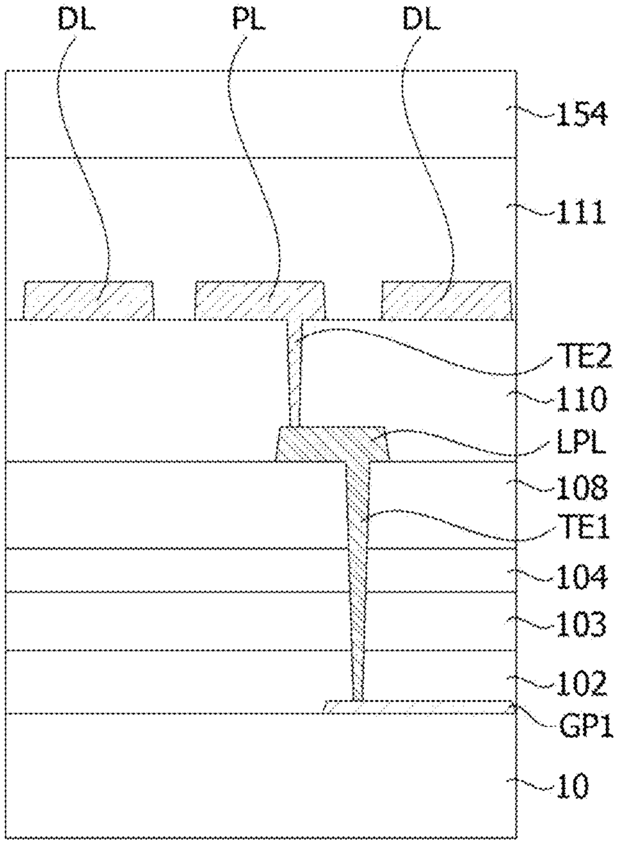
FIG. 11C is a modified example of FIG. 11B.

FIG. 8 is a view illustrating a display device according to a first embodiment of the present disclosure. FIG. 9 is an enlarged view of portion C of FIG. 8. FIG. 10 is a modified example of FIG. 9. FIG. 11A is a view illustrating a state in which a conductive pattern is connected to a power line. FIG. 11B is a cross-sectional view illustrating a state in which the conductive pattern is connected to the power line. FIG. 11C is a modified example of FIG. 11B.

Referring to FIGS. 8 and 9, a light-transmitting area TA in which various sensors are disposed may be formed in a circular shape, and a first non-display area NDA1 may be disposed around the light-transmitting area TA. However, the light-transmitting area TA is not necessarily limited thereto, and may have various shapes such as a polygonal shape and an elliptical shape, and the shape of the first non-display area NDA1 may also vary accordingly.

Dams DAM and a plurality of protruding patterns ST may be formed in the first non-display area NDA1 by using a plurality of layers extending from a display area. The number of dams DAM and protruding patterns ST is not particularly limited.

The dams DAM and the protruding patterns ST may each be disposed in a closed loop shape surrounding the light-transmitting area TA. With this configuration, moisture can be prevented from penetrating into the display area through the light-transmitting area TA.

A first etch stop pattern ES1 may prevent an etching solution from penetrating into a panel during etching a substrate 10. The first etch stop pattern ES1 may include an organic insulating layer or a metal layer which is not etched by the etching solution. The metal layer may include molybdenum (Mo) having strong chemical resistance to the etching solution.

The plurality of protruding patterns ST may be disposed in the first non-display area NDA1. The protruding pattern ST is formed to have an undercut shape, so that a light-emitting stack 152 formed in the first non-display area NDA1 may be disconnected. Thus, a moisture penetration path can be blocked.

The plurality of protruding patterns ST may include a first protruding pattern ST1, a second protruding pattern ST2, and a third protruding pattern ST3 disposed on the first etch stop pattern ES1.

A plurality of first protruding patterns ST1 may be disposed between a display area DA and the dam DAM, and a plurality of second protruding patterns ST2 may be disposed between the dam DAM and the first etch stop pattern ES1. A plurality of third protruding patterns ST3 may be disposed on the first etch stop pattern ES1.

The plurality of first protruding patterns ST1, the plurality of second protruding patterns ST2, and the plurality of third protruding patterns ST3 may have the same shape, but the present disclosure is not necessarily limited thereto. As an example, the first protruding pattern ST1 and the second protruding pattern ST2 may have the same shape, but the third protruding pattern ST3 may have a different shape. Each of the protruding patterns ST1, ST2, and ST3 may be variously modified as long as it has a structure capable of disconnecting the light-emitting stack 152.

The substrate 10 may have a first opening 11 formed in an area corresponding to the light-transmitting area TA. A diameter of the first opening 11 may be greater than that of the light-transmitting area TA.

A conductive pattern GP1 may be the same layer as one of metal layers disposed in the display area DA. That is, the conductive pattern GP1 may be a dummy area formed together when forming the metal layers in the display area DA. As an example, the conductive pattern GP1 may be a dummy layer formed at the same time when a light-blocking layer formed in the display area is formed.

The first etch stop pattern ES1 may be the same layer as one of organic insulating layers disposed in the display area DA. That is, the first etch stop pattern ES1 may be a dummy area formed together when the organic insulating layers are formed in the display area DA. As an example, the first etch stop pattern ES1 may be a dummy layer formed at the same time when a planarization layer formed in the display area is formed.

A side coating layer 31 may be formed on a first inclined surface 11*a* of the first opening 11. The side coating layer 31 may be disposed to surround the light-transmitting area TA. The light-transmitting area TA may be a through hole formed in the display panel including the substrate. The conductive pattern GP1 and the first etch stop pattern ES1 may be disposed on the side coating layer 31.

The side coating layer 31 may include a conductive material. As an example, the side coating layer 31 may be made such that conductive particles CP are dispersed in a polymer resin to allow electricity to flow. The conductive particles CP are not particularly limited as long as the conductive particles CP are made of a conductive material. As an example, the conductive particles CP may be any one of ITO nanoparticles, IZO nanoparticles, and Ag nanowires. However, the present disclosure is not necessarily limited thereto, and the side coating layer 31 can be made of a material that is conductive in itself without separate conductive particles CP.

According to the embodiment, since the light-transmitting area TA in which a camera is assembled is surrounded by the side coating layer 31 having conductivity, static electricity (exemplified by positive charges) generated in the light-transmitting area TA can move to the conductive pattern GP1 through the side coating layer 31. The conductive pattern GP1 may be connected to various lines or ground regions inside the panel. Accordingly, the static electricity adsorbed on the side coating layer 31 can be quickly removed from the light-transmitting area TA.

The conductive pattern GP1 and the first etch stop pattern ES1 disposed on the substrate 10 may protrude toward an inner side of the first opening 11. In this case, a distance L1 from the first inclined surface 11*a* to an end of the first etch stop pattern ES1 may be greater than a distance L2 from the first inclined surface 11*a* to an end of the conductive pattern GP1.

According to the embodiment, since the conductive pattern GP1 protrudes toward the inner side of the first opening 11 of the substrate 10, a lower surface GP1*a* of the conductive pattern GP1 may be in contact with the side coating layer 31. Accordingly, static electricity may be collected even on the lower surface GP1*a* of the conductive pattern GP1, so that the static electricity can be quickly removed. In addition, the conductive pattern GP1 may also perform an etching prevention function when the substrate 10 is etched. That is, in a first area EA1 of the first opening 11, the first etch stop pattern ES1 may prevent the penetration of the etching solution, and in a second area EA2, the conductive pattern GP1 may prevent the penetration of the etching solution.

An inorganic insulating layer 102 may be disposed between the conductive pattern GP1 and the first etch stop pattern ES1. The organic insulating layer is disposed on the inorganic insulating layer to increase an adhesion. Thus, the problem in which the organic insulating layer is delaminated from the substrate 10 can be improved. The inorganic insulating layer 102 may be an active buffer layer in the display area DA, but is not necessarily limited thereto, and may be selected from various inorganic insulating layers. However, the present disclosure is not necessarily limited thereto, and the inorganic insulating layer may be omitted. Accordingly, the first etch stop pattern ES1 may be directly formed on the conductive pattern GP1 to be in contact therewith.

According to the embodiment, when the diameter of the first opening 11 is made to be large so that the lower surface of the conductive pattern GP1 is exposed, the conductive pattern GP1 may overlap the substrate 10 in a vertical direction while the first etch stop pattern ES1 may not overlap the substrate 10 in the vertical direction. In a plan view, the first etch stop pattern ES1 may be disposed inside the first opening 11. In this case, an area exposed by the lower surface GP1*a* of the conductive pattern GP1 may be increased, which may be effective in eliminating static electricity.

A back coating layer 32 may be disposed below the substrate 10 and the side coating layer 31. The back coating layer 32 may be formed to further extend from a back surface of the substrate 10 up to the side coating layer 31.

In the display device according to the embodiment, a bonding strength of the back coating layer 32 may be improved by forming the back coating layer 32 to cover up to the side coating layer 31.

According to the embodiment, a side surface of the light-transmitting area TA may be vertically formed. That is, a side surface of the back coating layer 32, a side surface of the side coating layer 31, a side surface of the first etch stop pattern ES1, and a side surface of a polarizing plate 19, which form the side surface of the light-transmitting area TA, may be laser cut and formed to have the same vertical plane.

Referring to FIG. 10, the conductive pattern GP1 may be disposed on a back side of the first opening 11. That is, the first opening 11 may protrude further toward the light-transmitting area TA than the conductive pattern GP1 does by a first distance d1. In the case of such a structure, an upper surface of the substrate 10 may be exposed to an etching solution and etched during an etching process. Accordingly, an edge EG1 of the first inclined surface 11*a* is etched so that sharpness can be mitigated. With this configuration, it is possible to improve the occurrence of cracks at an edge of the substrate upon an external impact.

Since the inorganic insulating layer disposed on the conductive pattern GP1 has a lower chemical resistance than the conductive pattern GP1, the inorganic insulating layer may be etched more than the conductive pattern GP1 when exposed to the etching solution for the same amount of time. Thus, the conductive pattern GP1 may protrude further toward the light-transmitting area than the inorganic insulating layer does by a second distance d2.

Referring to FIGS. 11A and 11B, a plurality of light-transmitting areas TA may be disposed in the display area DA, and a plurality of data lines DL and a plurality of power lines PL may be disposed to bypass the light-transmitting areas TA in the first non-display area NDA1.

The conductive pattern GP1 is disposed to surround the light-transmitting area TA and may be connected to one of the plurality of power lines PL. The conductive pattern GP1 may be connected to one of the power lines PL through a through electrode TE1 in the non-display area. The power line PL may be disposed on an upper interlayer insulating layer 108, but the present disclosure is not necessarily limited thereto.

According to the embodiment, static electricity collected through the conductive pattern GP1 may be emitted to the outside through the power line. The power line PL connected to the conductive pattern GP1 may be a ground line. Thus, an output signal of the display area DA may not be affected. However, the present disclosure is not necessarily limited thereto, and the line to which the conductive pattern GP1 is connected may be a separate dummy line rather than the power line.

In the embodiment, the plurality of power lines PL connected to the conductive patterns GP1 may be connected to a connection line LPL formed in the form of a closed loop, and the conductive patterns GP1 may be connected to the connection line LPL. However, the ground connection structure is not necessarily limited thereto. As an example, the plurality of power lines PL may be spaced apart from each other so as to bypass the respective light-transmitting areas TA.

Referring to FIG. 11C, the conductive pattern GP1 may be connected to an SD2 line disposed on a first planarization layer 110 through a plurality of through electrodes TE1 and TE2. According to the embodiment, the conductive pattern GP1 may be connected to electrodes at various positions using the through electrodes.

Figure 12:
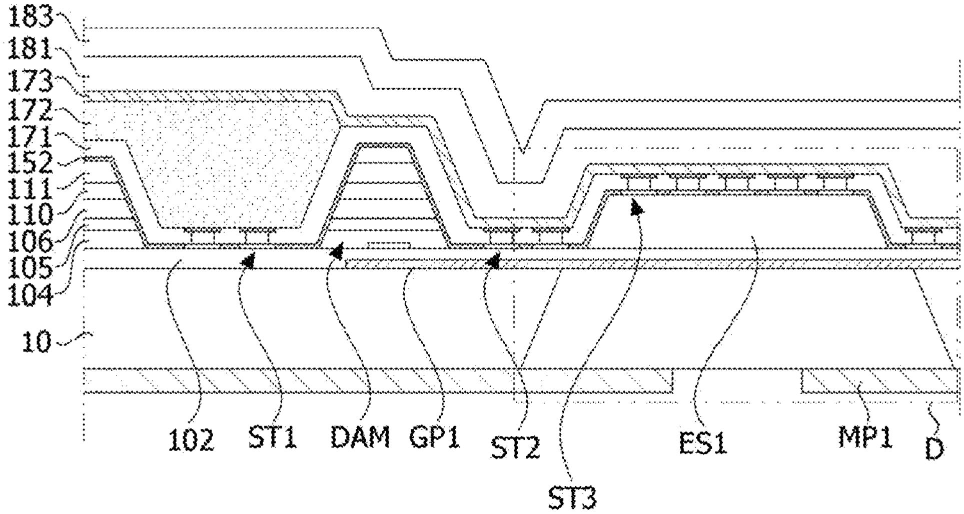
FIG. 12 is a view illustrating the display panel before forming a light-transmitting area.

FIG. 12 is a view illustrating the display panel before forming the light-transmitting area. FIGS. 13A to 13F are views illustrating a process of etching the substrate to form the light-transmitting area in the display panel.

Figure 13A:
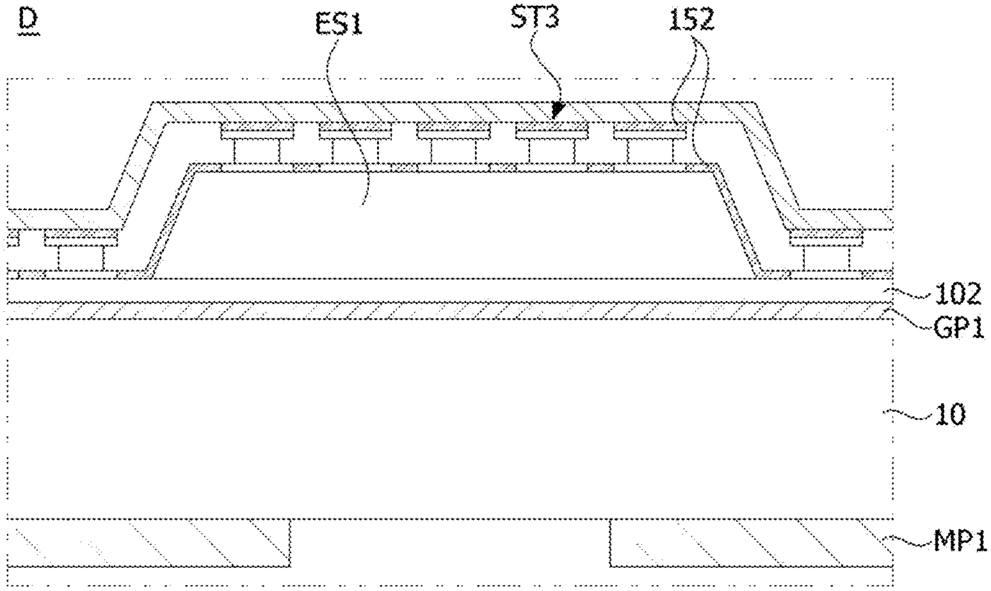
FIGS. 13A to 13F are views illustrating a process of etching a substrate to form the light-transmitting area in the display panel.

Referring to FIGS. 12 and 13A, mask patterns MP1 may be formed on a lower portion a substrate 10. According to the embodiment, a plurality of openings can be formed simultaneously by forming the mask patterns MP1 according to the number and shape of first openings 11 to be formed in the substrate 10 and exposing the substrate 10 to an etching solution.

Figure 13B:
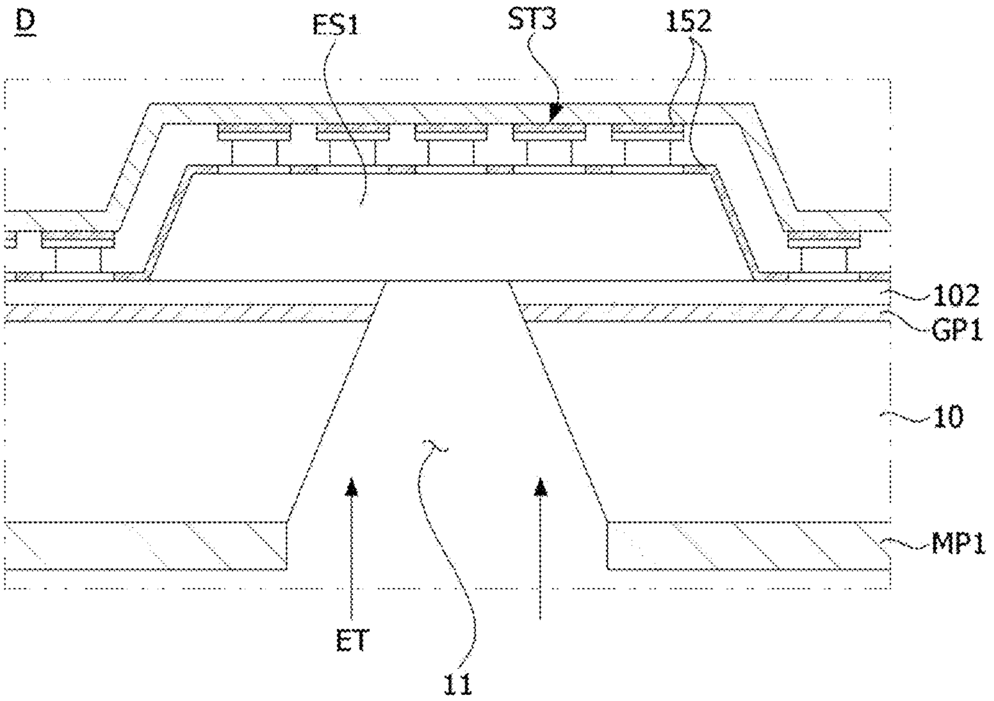

When the etching solution is brought into contact with an exposed area as shown in FIG. 13B, the area in which the substrate 10 is exposed may be gradually etched. At this time, a conductive pattern GP1 and an inorganic insulating layer 102 formed on the etched substrate 10 may be etched by an etching solution CT as time elapses. However, the etching solution does not penetrate into a panel by a first etch stop pattern ES1 disposed on the inorganic insulating layer 102. The first etch stop pattern ES1 may be formed using various organic insulating layers and/or metal films formed in a display area DA.

The inorganic insulating layer has low chemical resistance to the etching solution and thus is etched relatively quickly, but the conductive pattern GP1 is made of a metal material such as molybdenum (Mo) and thus may be etched relatively slowly.

Figure 13C:
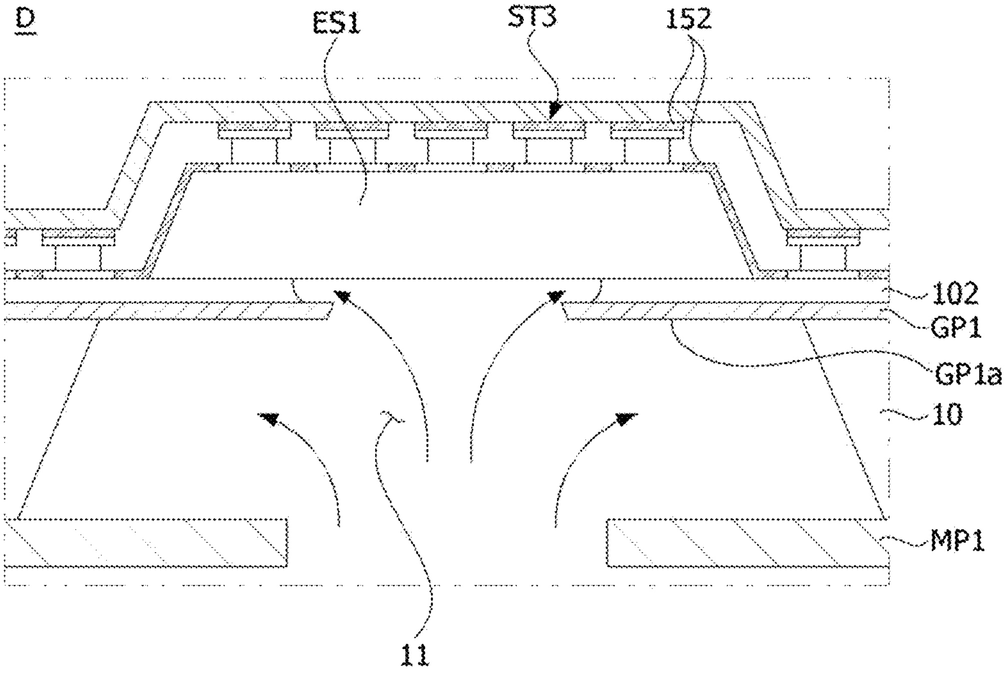

Referring to FIG. 13C, as etching time increases, the substrate 10 may be gradually etched so that a diameter of the first opening 11 may be increased. Thus, a lower surface GP1*a* of the conductive pattern GP1 may be gradually exposed to the outside. In this case, the conductive pattern GP1 may partially serve as an etch stop layer.

With this configuration, the diameter of the first opening 11 may be made to be large, and an area of a first non-display area NDA1 may be made to be relatively small, thereby reducing a bezel area.

Figure 13D:
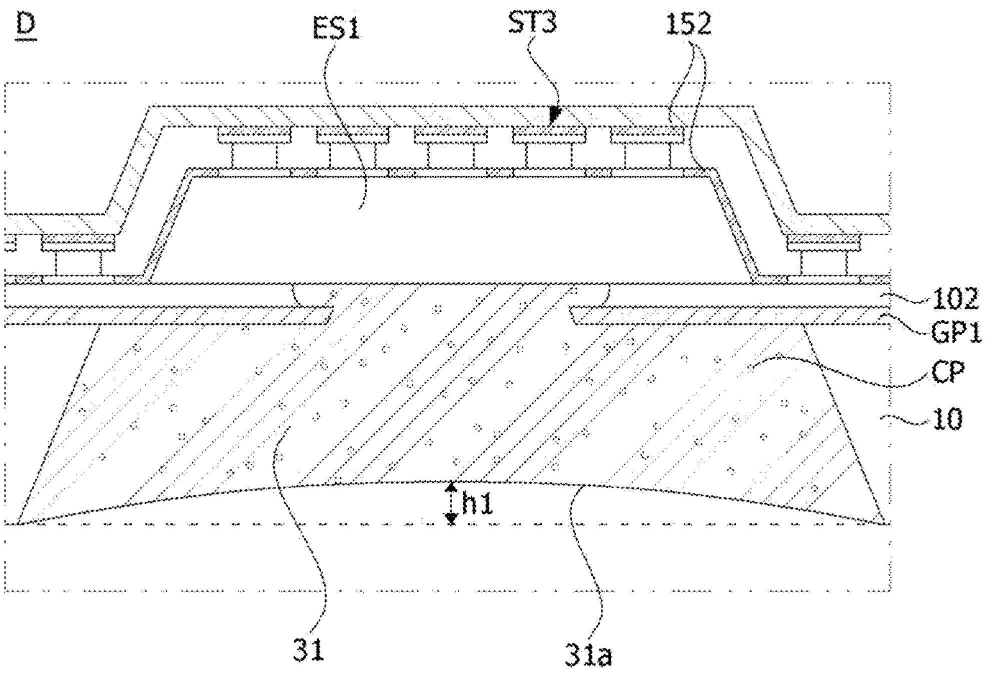

Referring to FIG. 13D, a side coating layer 31 may be filled in the first opening 11 of the substrate 10. The side coating layer 31 may be produced by filling the first opening 11 with a polymer resin in which conductive particles CP are dispersed, and followed by curing. The side coating layer 31 includes the conductive particles CP and thus can be electrically connected to the conductive pattern GP1. The side coating layer 31 may contract during curing so that a lower surface 31*a* may be formed to be concave by a selected (or predetermined) height h1, but may not contract depending on a material.

Figure 13E:
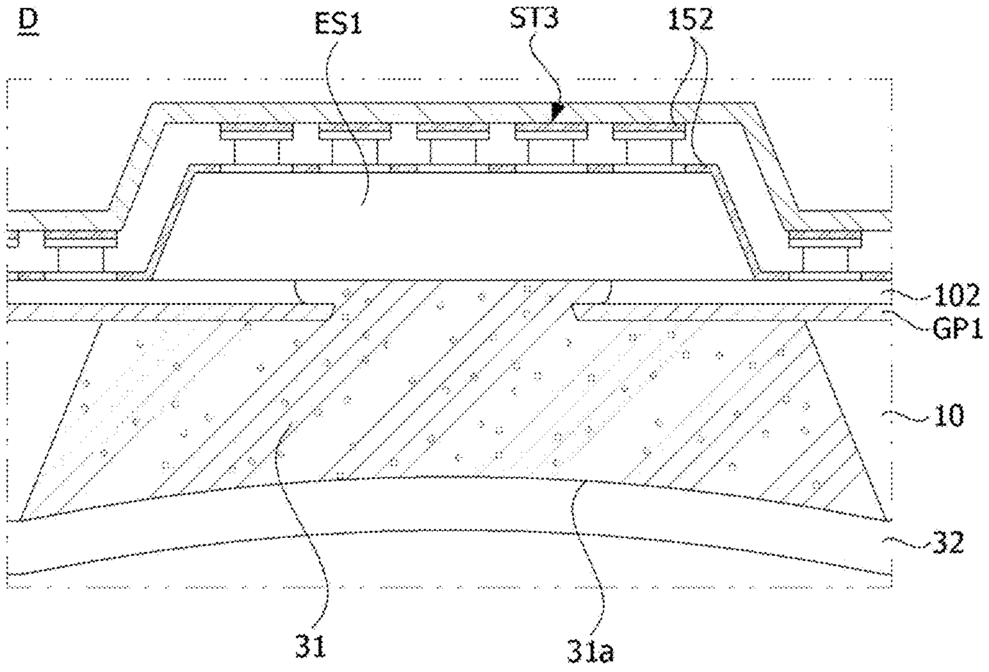

Referring to FIG. 13E, a back coating layer 32 may be entirely formed on a lower surface of the substrate 10 and the lower surface of the side coating layer 31. However, the present disclosure is not necessarily limited thereto, and the back coating layer 32 may be formed only on the lower surface of the substrate 10.

Figure 13F:
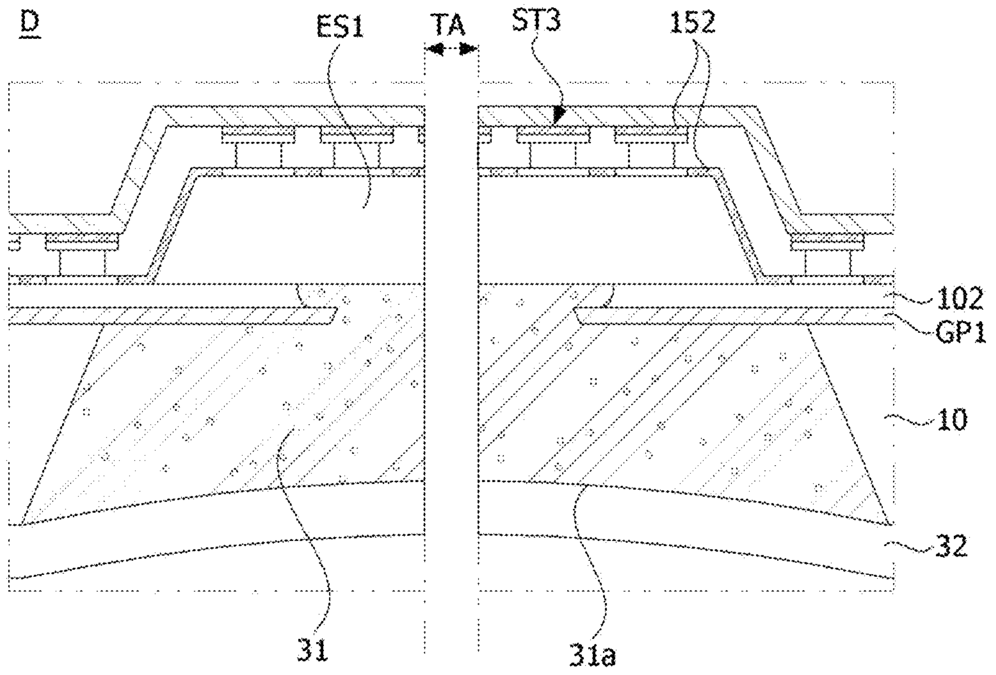

Referring to FIG. 13F, a light-transmitting area TA may be formed by irradiating a laser to the first opening 11 of the substrate 10. At this time, the first etch stop pattern ES1 and a third protruding pattern ST3 disposed above the substrate 10 may be cut by a laser.

Figure 14:
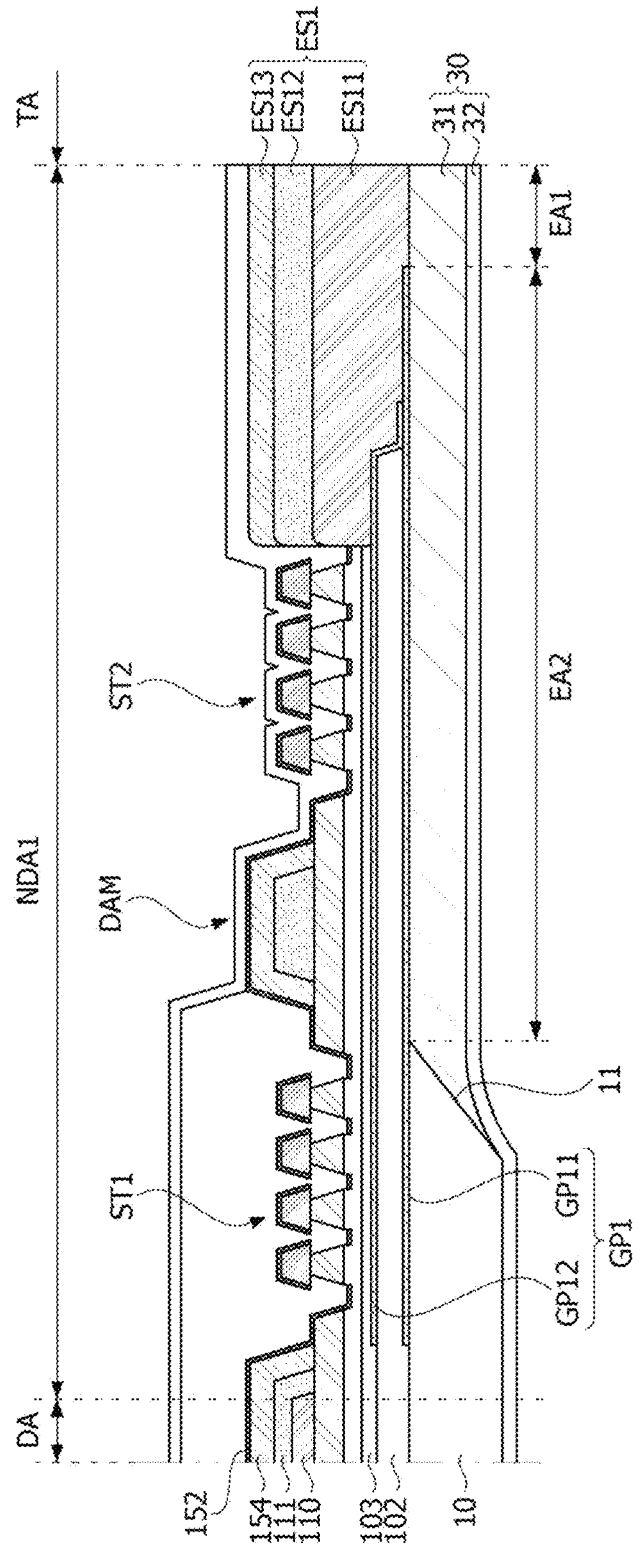
FIG. 14 is a view illustrating a display device according to a second embodiment of the present disclosure.
Figure 15:
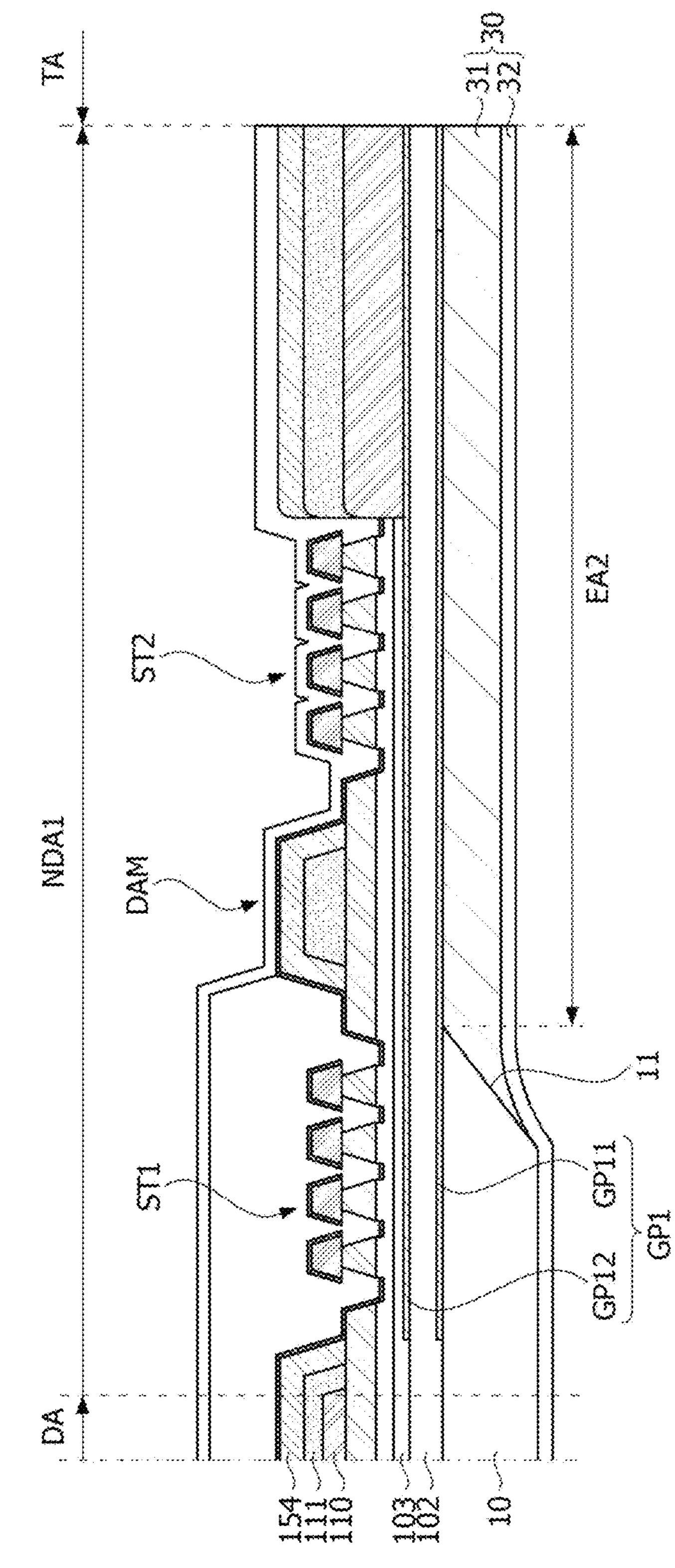
FIG. 15 is a modified example of FIG. 14.

FIG. 14 is a view illustrating a display device according to a second embodiment of the present disclosure. FIG. 15 is a modified example of FIG. 14.

Referring to FIG. 14, a light-transmitting area TA in which various sensors are disposed may be formed in a circular shape, and a first non-display area NDA1 may be disposed around the light-transmitting area TA. However, the light-transmitting area TA is not necessarily limited thereto, and may have various shapes such as a polygonal shape and an elliptical shape, and the shape of the first non-display area NDA1 may also vary accordingly.

Dams DAM and a plurality of protruding patterns ST may be formed in the first non-display area NDA1 by using a plurality of layers extending from a display area DA. The number of dams DAM and protruding patterns ST is not particularly limited.

The dams DAM and the protruding patterns ST may each be disposed in a closed loop shape surrounding the light-transmitting area TA. With this configuration, moisture can be prevented from penetrating into the display area DA through the light-transmitting area TA.

A conductive pattern GP1 may include a first conductive pattern GP11 and a second conductive pattern GP12 disposed on a substrate 10. An inorganic insulating layer 102 may be disposed between the first conductive pattern GP11 and the second conductive pattern GP12.

The first conductive pattern GP11 and the second conductive pattern GP12 may be in contact with each other in an area overlapping a first etch stop pattern ES1. With such a structure, an end of the first conductive pattern GP11 and an end of the second conductive pattern GP12 are disposed below the first etch stop pattern ES1, so that a phenomenon in which the first conductive pattern GP11 and the second conductive pattern GP12 are delaminated from the substrate 10 may be improved.

The first conductive pattern GP11 may be the same layer as a first light-blocking layer in the display area DA, and the second conductive pattern GP12 may be the same layer as a second light-blocking layer in the display area DA. Here, the same layer may refer to a dummy layer formed at the same time when forming the light-blocking layer. Accordingly, the first conductive pattern GP11 and the second conductive pattern GP12 may be made of molybdenum (Mo) that is the same material as a material of the light-blocking layer. However, the present disclosure is not necessarily limited thereto, and the conductive pattern GP1 may also be made of a Cu/MoTi material when the light-blocking layer is made of Cu/MoTi.

The conductive pattern GP1 and the first etch stop pattern ES1 may protrude toward an inner side of a first opening 11. Accordingly, when forming the first opening 11, the etch stop pattern may prevent an etching solution from penetrating into a first area EA1, and the conductive pattern GP1 may prevent the etching solution from penetrating into a second area EA2.

When a diameter of the first opening 11 of the substrate 10 increases, a first inclined surface of the first opening 11 is disposed on a back side of the dam DAM to reduce an area of a bezel region.

Referring to FIG. 15, the first conductive pattern GP11, the inorganic insulating layer 102, and the second conductive pattern GP12 may be entirely disposed below the first etch stop pattern ES1. In this case, the conductive pattern GP1 may be entirely disposed on the first opening 11. With this configuration, the bezel region can be reduced by using a stacked structure of metal and inorganic films with a low etch rate as the etch stop layer and overlapping the etch stop layer structure on a lower portion of the protruding pattern ST.

Figure 16:
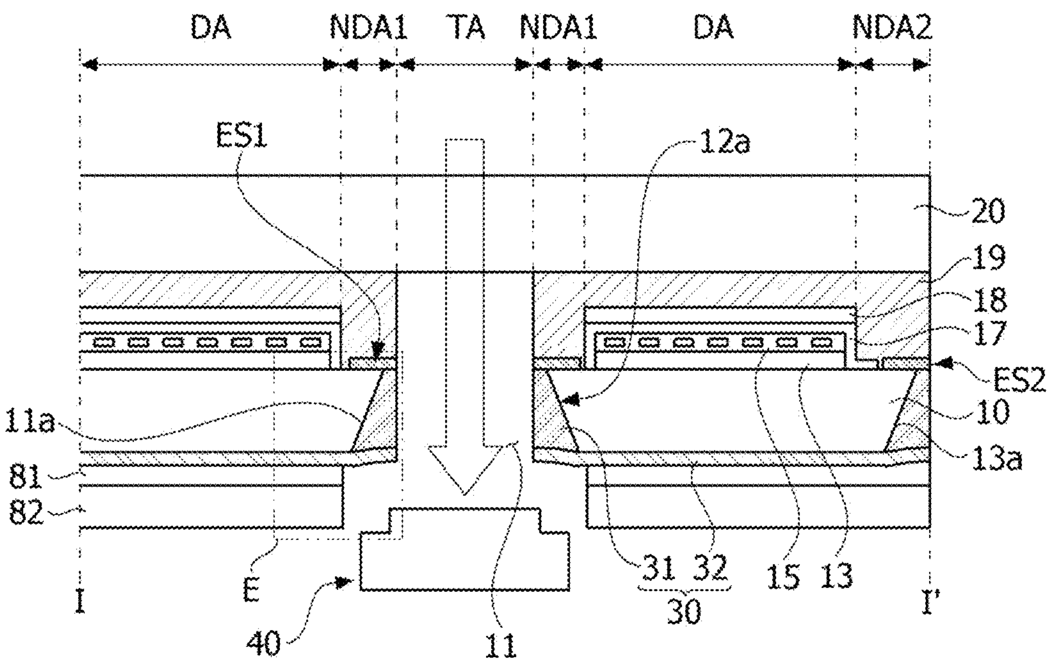
FIG. 16 is a view illustrating a display device according to a third embodiment of the present disclosure.
Figure 17:
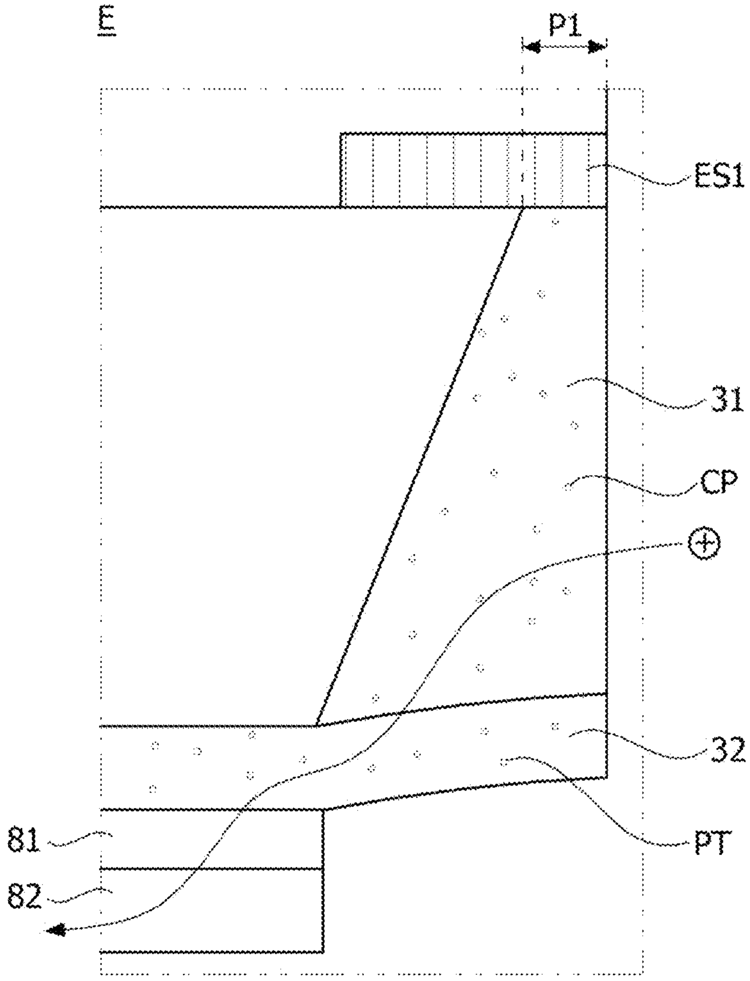
FIG. 17 is an enlarged view of portion E of FIG. 16.

FIG. 16 is a view illustrating a display device according to a third embodiment of the present disclosure. FIG. 17 is an enlarged view of portion E of FIG. 16.

Referring to FIG. 16, a substrate 10 may include a first opening 11 disposed in a light-transmitting area TA. The first opening 11 may have a tapered shape that narrows in width as it approaches a cover glass 20. However, the first opening 11 is not necessarily limited thereto, and may have a tapered shape that increases in width as it approaches the cover glass 20, or may be constant in width in a thickness direction. The tapered shape of the first opening 11 may be variously changed by the type of an etching solution and an etching method.

A first etch stop pattern ES1 may be disposed on the first opening 11 of the substrate 10. In addition, a second etch stop pattern ES2 may be disposed at an edge of the substrate 10. The first etch stop pattern ES1 and the second etch stop pattern ES2 may prevent an etching solution from penetrating into a panel when etching the substrate 10.

The first etch stop pattern ES1 and the second etch stop pattern ES2 may be formed by extending at least one of layers constituting a circuit portion 13, a light-emitting element portion 15, an encapsulation portion 17, and a touch portion 18. That is, the first etch stop pattern ES1 and the second etch stop pattern ES2 may be dummy layers extending from the circuit portion 13, the light-emitting element portion 15, the encapsulation portion 17, and the touch portion 18. With this configuration, the etch stop pattern may be formed without adding a separate process.

According to the embodiment, the first etch stop pattern ES1 may include a protrusion P1 protruding toward an inner side of the first opening 11. The protrusion P1 may be defined as a portion more protruding toward an inner side of the light-transmitting area TA than an upper surface of the first opening 11. The protrusion P1 may be formed in a process of laser cutting the etch stop pattern.

A coating layer 30 may include a side coating layer 31 formed on an inner side surface of the first opening 11, and a back coating layer 32 disposed on a lower portion of the substrate 10.

According to the embodiment, the side coating layer 31 and the back coating layer 32 may include a conductive material. As an example, the side coating layer 31 and the back coating layer 32 may be made with conductive particles CP dispersed therein to allow electricity to flow. The conductive particles CP are not particularly limited as long as the conductive particles CP are made of a conductive material. As an example, the conductive particles CP may be any one of ITO nanoparticles, IZO nanoparticles, and Ag nanowires.

However, the present disclosure is not necessarily limited thereto, and the side coating layer 31 and the back coating layer 32 can be made of a material that is conductive in itself without separate conductive particles CP. As an example, the side coating layer 31 and the back coating layer 32 may be conductive polymers. As an example, the conductive polymer may be one of polyaniline, polythiophene, poly(3,4-ethylenedioxythiophene) (PEDOT), and polypyrrole, but the present disclosure is not necessarily limited thereto.

According to the embodiment, since the light-transmitting area TA in which a camera is assembled is surrounded by the side coating layer 31 and the back coating layer 32 having conductivity, static electricity (exemplified by positive charges) generated in the light-transmitting area can be discharged to a heat dissipation plate 82 disposed below the side coating layer 31 and the back coating layer 32 through the side coating layer 31 and the back coating layer 32. The heat dissipation plate 82 may be made of a conductive material such as graphite, but the present disclosure is not necessarily limited thereto. In addition, a conductive sub-member 81 may be additionally disposed between the back coating layer 32 and the heat dissipation plate.

Figure 18:
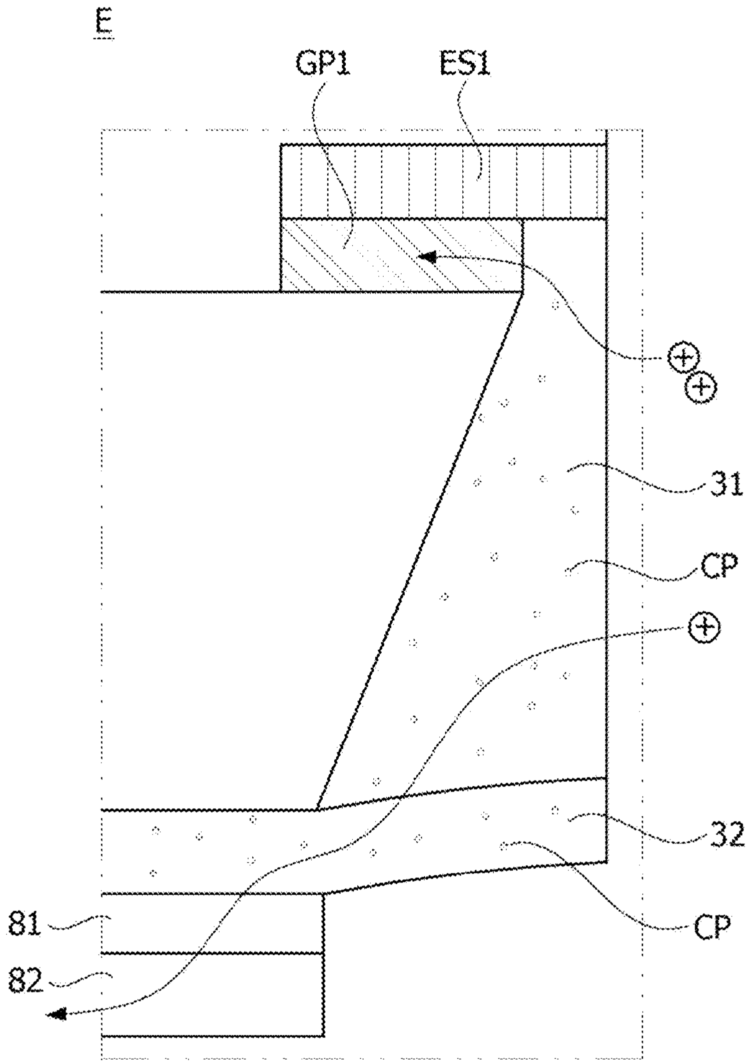
FIG. 18 is a view illustrating a display device according to a fourth embodiment of the present disclosure.

FIG. 18 is a view illustrating a display device according to a fourth embodiment of the present disclosure.

Referring to FIG. 18, a conductive pattern GP1 may be formed on a substrate 10, and a side coating layer 31 and a back coating layer 32 may include a conductive material.

Static electricity of a light-transmitting area TA may be introduced into the side coating layer 31 and discharged to the outside through the conductive pattern GP1 or may be discharged to the outside through a heat dissipation plate 82. Accordingly, it is possible to quickly discharge the static electricity to prevent damage to a camera.

According to the embodiment, the conductive pattern GP1, the side coating layer 31, the back coating layer 32, and the heat dissipation plate 82 may be electrically connected to each other. The conductive pattern GP1 may discharge the static electricity through a ground line disposed in a display area. Alternatively, a separate dummy line may be connected to the conductive pattern GP1. Thus, pixel driving may not be affected.

Since the content of the present disclosure described in the problems to be solved, the problem-solving means, and effects does not specify essential features of the claims, the scope of the claims is not limited to matters described in the content of the disclosure.

According to the present embodiment, the degradation of camera performance can be prevented by removing static electricity generated around a camera.

In addition, there is an advantage in process optimization that allows holes of various shapes to be formed simultaneously in a panel when cutting a mother substrate.

In addition, post-processing and component assembly can be facilitated by processing an edge of a glass substrate.

Effects of the present disclosure will not be limited to the above-mentioned effects and other unmentioned effects will be clearly understood by those skilled in the art from the following claims.

While the embodiments of the present disclosure have been described in detail above with reference to the accompanying drawings, the present disclosure is not necessarily limited to these embodiments, and various changes and modifications may be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by these embodiments. Accordingly, the above-described embodiments should be understood to be exemplary and not limiting in any aspect.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a substrate including a display area, a light-transmitting area, a non-display area adjacent to the light-transmitting area, and a first opening that is disposed at a position corresponding to the light-transmitting area;

a circuit portion and a light-emitting element portion that are disposed in the display area;

a conductive pattern disposed in the non-display area;

an etch stop pattern disposed in the non-display area; and a first coating layer disposed on an inner side surface of the substrate defining the first opening and having conductivity, the first coating layer extending from the conductive pattern and the etch stop pattern, wherein the inner side surface of the substrate connects to an upper surface of the substrate and a bottom surface of the substrate, and wherein the conductive pattern is electrically connected to the first coating layer.

2. The display device of claim 1, wherein the etch stop pattern does not overlap the substrate, and wherein the etch stop pattern is disposed in the first opening in a plan view.

3. The display device of claim 1, wherein the etch stop pattern includes a plurality of etch stop patterns disposed in the first opening.

4. The display device of claim 1, further comprising a dam and a plurality of protruding patterns disposed in the non-display area, wherein the plurality of protruding patterns include:

a plurality of first protruding patterns disposed in a first area between the display area and the dam;

a plurality of second protruding patterns disposed between the dam and the etch stop pattern; and a plurality of third protruding patterns disposed on the etch stop pattern.

5. The display device of claim 1, wherein the conductive pattern is the same layer as one of metal layers disposed in the display area and wherein the conductive pattern is electrically connected to one of a plurality of lines electrically connected to the display area.

6. The display device of claim 5, further comprising a connection line configured to electrically connect a plurality of power lines bypassing the light-transmitting area, wherein the conductive pattern is electrically connected to the connection line.

7. The display device of claim 1, wherein the etch stop pattern protrudes toward an inner side of the first opening, and wherein the conductive pattern protrudes toward the inner side of the first opening.

8. The display device of claim 7, wherein the etch stop pattern protrudes further toward the light-transmitting area than the conductive pattern does.

9. The display device of claim 1, wherein the conductive pattern includes a first conductive pattern disposed on the substrate and a second conductive pattern disposed on the first conductive pattern.

10. The display device of claim 9, wherein an end of the first conductive pattern and an end of the second conductive pattern are electrically connected at a lower portion of the etch stop pattern.

11. The display device of claim 9, wherein the display area includes:

a first light-blocking layer disposed on the substrate;

a buffer layer disposed on the first light-blocking layer;

a second light-blocking layer disposed on the buffer layer; and a first semiconductor layer disposed on the second light-blocking layer, wherein the first conductive pattern is the same layer as the first light-blocking layer, and wherein the second conductive pattern is the same layer as the second light-blocking layer.

12. A display device, comprising:

a substrate including a display area, a light-transmitting area, and a non-display area adjacent to the light-transmitting area, and further including a first opening disposed at a position corresponding to the light-transmitting area;

a circuit portion and a light-emitting element portion that are disposed in the display area;

an etch stop pattern disposed in the non-display area;

a first coating layer disposed on a side surface of the first opening; and a second coating layer disposed on a lower surface of the substrate and a lower surface of the first coating layer, wherein the first coating layer and the second coating layer are conductive and electrically connected to each other.

13. The display device of claim 12, further comprising a heat dissipation plate disposed below the second coating layer, wherein the first coating layer, the second coating layer, and the heat dissipation plate are electrically connected to each other.

14. The display device of claim 12, wherein an angle of an inclined surface of the first opening is equal to an angle of an inclined surface of an outermost side surface of the substrate.

15. The display device of claim 12, wherein the etch stop pattern protrudes toward an inner side of the first opening.

16. The display device of claim 15, further comprising a conductive pattern disposed on the substrate and electrically connected to the first coating layer.

17. A display device, comprising:

a substrate having an opening, the substrate having an outermost side surface, a first inclined surface, a second inclined surface, a first top surface, a second top surface, a first bottom surface, a second bottom surface, and a first end point, the opening positioned between the first inclined surface and the second inclined surface opposite the first inclined surface, the first inclined surface between the first top surface and the first bottom surface, the second inclined surface between the first bottom surface and the second bottom surface, the first top surface and the first inclined surface contacting each other at the first end point;

an etch stop pattern having a first portion and a second portion, the first portion of the etch stop pattern being adjacent to the first inclined surface and the second portion of the etch stop pattern being adjacent to the second inclined surface; and a conductive pattern on the first top surface of the substrate, the conductive pattern between the first portion of the etch stop pattern and the substrate, the conductive pattern extending towards the opening, wherein the conductive pattern does not extend beyond the first end point.

18. The display device of claim 17, wherein the etch stop pattern includes a protrusion, wherein the protrusion extends towards the opening, wherein the protrusion of the etch stop pattern extends beyond the first end point.

19. The display device of claim 17, further comprising:

a second etch stop pattern adjacent to the outermost side surface of the substrate, wherein the second etch stop pattern is formed along the outermost side surface of the substrate such that the second etch stop pattern entirely surrounds the substrate, wherein the second etch stop pattern includes a second protrusion, and wherein the second protrusion of the second etch stop pattern extending beyond the outermost side surface of the substrate.

20. The display device of claim 17, wherein the substrate includes a glass substrate.

21. The display device of claim 17, further comprising:

a coating layer adjacent to the first inclined surface of the substrate and the first bottom surface of the substrate, wherein the coating layer includes a side coating layer adjacent to the first inclined surface of the substrate and contacting the substrate, and wherein the side coating layer includes conductive particles.

22. The display device of claim 21, wherein the conductive pattern is electrically connected to the side coating layer, and wherein the side coating layer extends towards the etch stop pattern and contacts the etch stop pattern and the conductive pattern.

23. The display device of claim 22, further comprising:

a back coating layer adjacent to the first bottom surface of the substrate and contacting the substrate, wherein the back coating layer contacts the side coating layer, and wherein the back coating layer includes a conductive material.

* * * * *